(12) United States Patent
Choi et al.

(10) Patent No.: US 11,595,013 B2
(45) Date of Patent: Feb. 28, 2023

(54) MULTILAYER ELECTRONIC DEVICE INCLUDING A HIGH PRECISION INDUCTOR

(71) Applicant: AVX Corporation, Fountain Inn, SC (US)

(72) Inventors: Kwang Choi, Simpsonville, SC (US); Marianne Berolini, Greenville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 335 days.

(21) Appl. No.: 16/720,045

(22) Filed: Dec. 19, 2019

(65) Prior Publication Data

US 2020/0205285 A1     Jun. 25, 2020

Related U.S. Application Data

(60) Provisional application No. 62/782,501, filed on Dec. 20, 2018, provisional application No. 62/850,106, filed on May 20, 2019.

(51) Int. Cl.
  *H03H 7/01* (2006.01)
  *H05K 1/02* (2006.01)
  (Continued)

(52) U.S. Cl.
  CPC ....... *H03H 7/0115* (2013.01); *H01F 17/0013* (2013.01); *H03H 7/0138* (2013.01);
  (Continued)

(58) Field of Classification Search
  CPC .................... H03H 2001/0085; H03H 7/0115
  (Continued)

(56) References Cited

U.S. PATENT DOCUMENTS 5,357,227 A    10/1994   Tonegawa et al.
6,191,667 B1   2/2001    Takenaka et al.
(Continued)

FOREIGN PATENT DOCUMENTS

CN    1855613 A    11/2006
CN    102354777 A   2/2012
(Continued)

OTHER PUBLICATIONS

Dissertation of Seunghyun Eddy Hwang to Georgia Institute of Technology entitled "Characterization and Design of Embedded Passive Circuits for Applications Up to Millimeter-Wave Frequency," dated Aug. 2011, 196 pages.
(Continued)

*Primary Examiner* — Rakesh B Patel
(74) *Attorney, Agent, or Firm* — Dority & Manning, P.A.

(57) ABSTRACT

A multilayer electronic device may include a plurality of dielectric layers and a signal path having an input and an output. An inductor may include a conductive layer formed on one of the plurality of dielectric layers and may be electrically connected at a first location with the signal path and electrically connected at a second location with at least one of the signal path or a ground. The inductor may include an outer perimeter that includes a first straight edge facing outward in a first direction and a second straight edge parallel to the first straight edge and facing outward in the first direction. The second straight edge may be offset from the first straight edge by an offset distance that is less than about 500 microns and less than about 90% of a first width of the inductor in the first direction at the first straight edge.

23 Claims, 30 Drawing Sheets

(51) Int. Cl.
*H01F 17/00* (2006.01)
*H05K 1/16* (2006.01)

(52) U.S. Cl.
CPC ......... *H05K 1/0233* (2013.01); *H05K 1/0298* (2013.01); *H05K 1/165* (2013.01)

(58) Field of Classification Search
USPC .................................................. 333/175, 185
See application file for complete search history.

(56) References Cited

U.S. PATENT DOCUMENTS

| | | |
|---|---|---|
| 6,529,101 B2 | 3/2003 | Tojyo et al. |
| 6,556,416 B2 | 4/2003 | Kunihiro |
| 6,720,848 B2 | 4/2004 | Okamura et al. |
| 6,734,755 B2 | 5/2004 | Cites et al. |
| 6,771,148 B2 | 8/2004 | Okamura et al. |
| 6,791,435 B2 | 9/2004 | Shingaki et al. |
| 6,900,708 B2 | 5/2005 | White et al. |
| 6,958,667 B2 | 10/2005 | Mizoguchi et al. |
| 6,970,057 B2 | 11/2005 | Lin et al. |
| 7,068,124 B2 | 6/2006 | White et al. |
| 7,098,760 B2 | 8/2006 | Okamura et al. |
| 7,119,639 B2 | 10/2006 | Okamura et al. |
| 7,126,444 B2 | 10/2006 | Fukinaga et al. |
| 7,187,109 B2 | 3/2007 | Tikka et al. |
| 7,239,219 B2 | 7/2007 | Brown et al. |
| 7,239,221 B2 | 7/2007 | Okamura et al. |
| 7,245,194 B2 | 7/2007 | Muto |
| 7,268,648 B2 | 9/2007 | Okamura et al. |
| 7,312,676 B2 | 12/2007 | Kundu |
| 7,592,885 B2 | 9/2009 | Sekine et al. |
| 7,612,634 B2 | 11/2009 | Iwata |
| 7,652,554 B2 | 1/2010 | Moriai et al. |
| 7,907,034 B2 | 3/2011 | Taniguchi |
| 8,013,688 B2 | 9/2011 | White et al. |
| 8,067,723 B2 | 11/2011 | Yamada et al. |
| 8,106,722 B2 | 1/2012 | Shimamura et al. |
| 8,159,313 B2 | 4/2012 | Uchaykin |
| 8,179,210 B2 | 5/2012 | Feichtinger |
| 8,384,013 B2 | 2/2013 | Yamada et al. |
| 8,390,984 B2 | 3/2013 | Liu et al. |
| 8,405,468 B2 | 3/2013 | Uchaykin |
| 8,446,705 B2 | 5/2013 | Ritter et al. |
| 8,451,073 B2 | 5/2013 | Hoeft et al. |
| 8,659,871 B2 | 2/2014 | Togashi et al. |
| 8,754,726 B2 | 6/2014 | Sasaki et al. |
| 9,142,342 B2 | 9/2015 | Haner |
| 9,218,910 B2 | 12/2015 | Kim |
| 9,240,392 B2 | 1/2016 | Hurwitz et al. |
| 9,287,845 B2 | 3/2016 | Fukamachi et al. |
| 9,349,788 B2 | 5/2016 | Hurwitz et al. |
| 9,647,313 B2 | 5/2017 | Marconi et al. |
| 9,698,747 B2 | 7/2017 | Ishizuka |
| 9,935,603 B2 | 4/2018 | Imamura |
| 9,949,373 B2 | 4/2018 | Hurwitz et al. |
| 10,014,843 B2 | 7/2018 | Hurwitz et al. |
| 10,063,211 B2 | 8/2018 | Yehezkely et al. |
| 10,110,196 B2 | 10/2018 | Mukai |
| 10,218,330 B2 | 2/2019 | Park et al. |
| 10,236,854 B2 | 3/2019 | Hurwitz et al. |
| 10,277,190 B2 | 4/2019 | Masuda et al. |
| 10,389,329 B2 | 8/2019 | Shiokawa |
| 10,466,335 B2 | 10/2019 | Hurwitz et al. |
| 10,763,214 B2 | 9/2020 | Kariyazaki et al. |
| 10,944,375 B2 | 3/2021 | Imamura |
| 11,114,993 B2 | 9/2021 | Choi et al. |
| 2006/0055489 A1 | 3/2006 | Okamuara et al. |
| 2007/0085108 A1 | 4/2007 | White et al. |
| 2008/0047743 A1 | 2/2008 | Komatsu et al. |
| 2008/0116998 A1* | 5/2008 | Sekine ................. H03H 7/0115 333/185 |
| 2009/0033439 A1 | 2/2009 | Igarashi |
| 2011/0074527 A1* | 3/2011 | Wakata .................... H03H 7/09 333/204 |
| 2011/0133860 A1* | 6/2011 | Fukamachi .............. H03H 7/09 333/204 |
| 2014/0153154 A1 | 6/2014 | Choi et al. |
| 2015/0188511 A1* | 7/2015 | Ishizuka .................. H03H 7/38 333/32 |
| 2015/0296617 A1 | 10/2015 | Hurwitz et al. |
| 2016/0126003 A1* | 5/2016 | Lim ..................... H01F 17/0013 336/200 |
| 2016/0307702 A1 | 10/2016 | Tanaka et al. |
| 2017/0019083 A1* | 1/2017 | Fukae ....................... H03H 1/02 |
| 2017/0133997 A1 | 5/2017 | Imamura |
| 2020/0203075 A1 | 6/2020 | Choi et al. |
| 2020/0204137 A1 | 6/2020 | Choi et al. |
| 2020/0204138 A1 | 6/2020 | Choi et al. |
| 2020/0204142 A1 | 6/2020 | Choi et al. |

FOREIGN PATENT DOCUMENTS

| | | |
|---|---|---|
| EP | 2 068 393 A1 | 6/2009 |
| JP | H 03209905 A | 9/1991 |
| JP | H 0846469 A | 2/1996 |
| JP | 2008004768 A | 1/2008 |
| JP | 2008017243 A | 1/2008 |
| JP | 4539422 B2 | 9/2010 |
| JP | 5152192 B2 | 2/2013 |
| JP | 2018067612 A | 4/2018 |
| KR | 20170004238 A | 1/2017 |
| TW | 548669 B | 8/2003 |
| WO | WO 2004/004061 | 1/2004 |

OTHER PUBLICATIONS

International Search Report and Written Opinion for PCT/US2019/067378 dated Apr. 143, 2020, 11 pagesX.

* cited by examiner

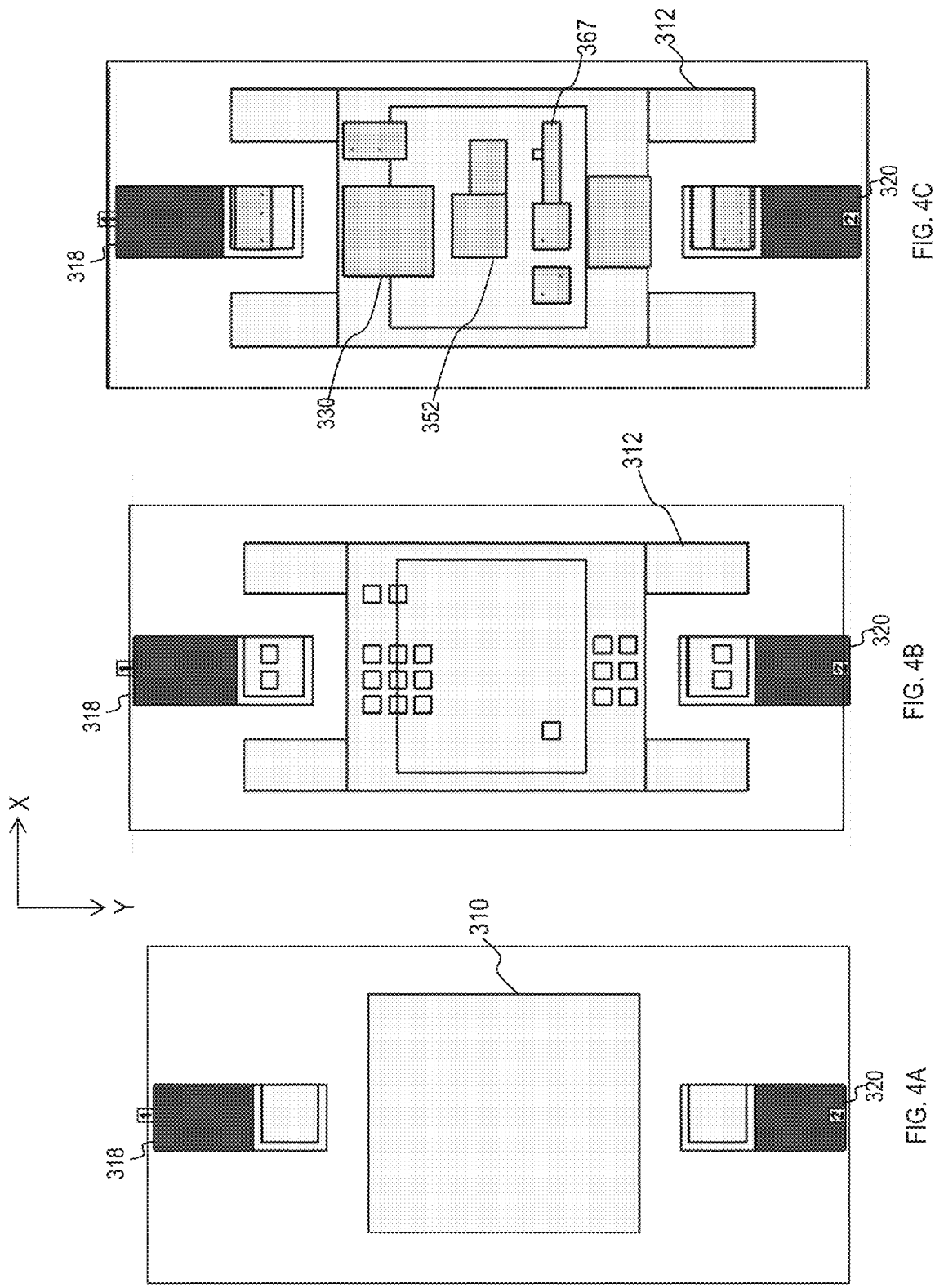

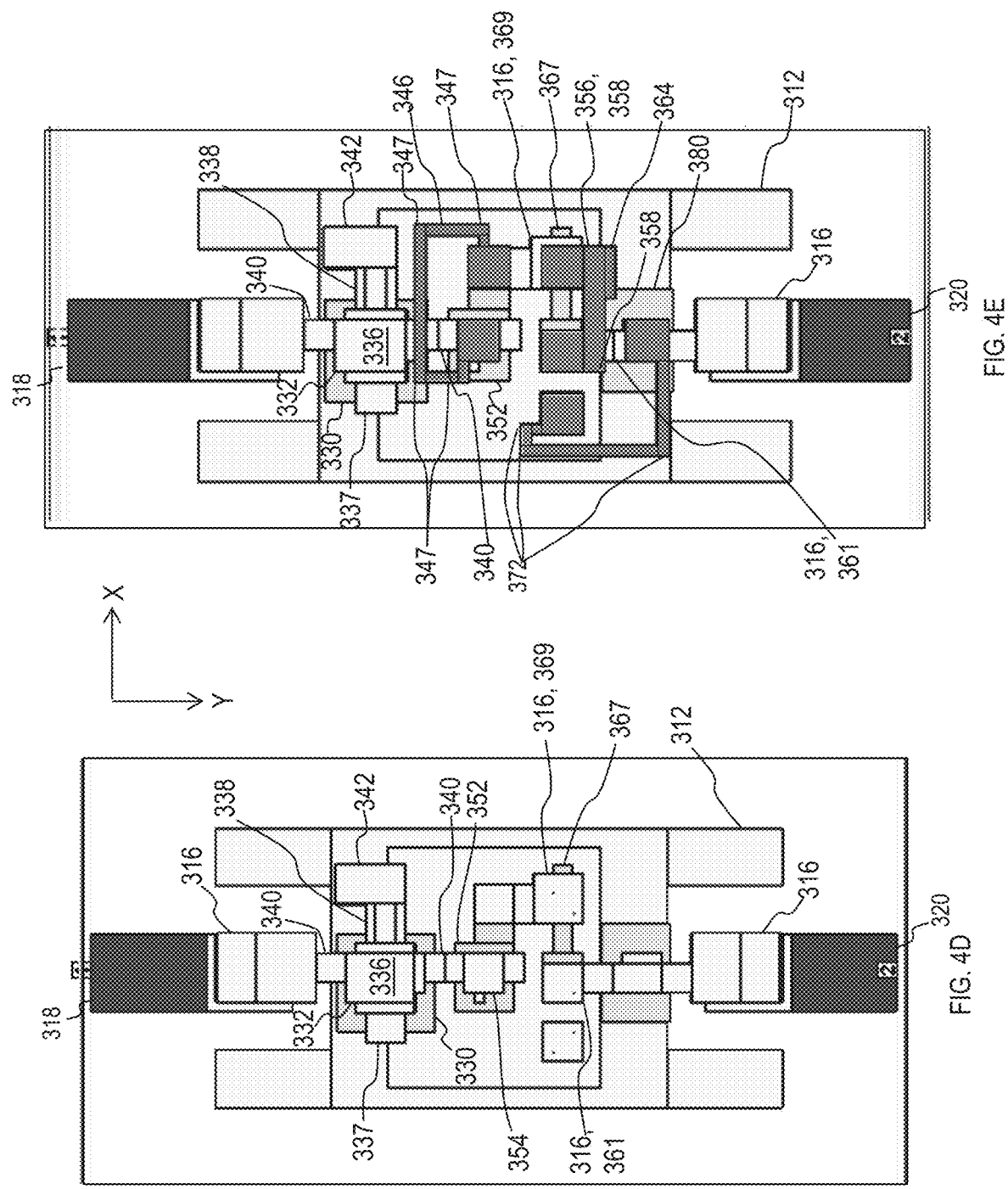

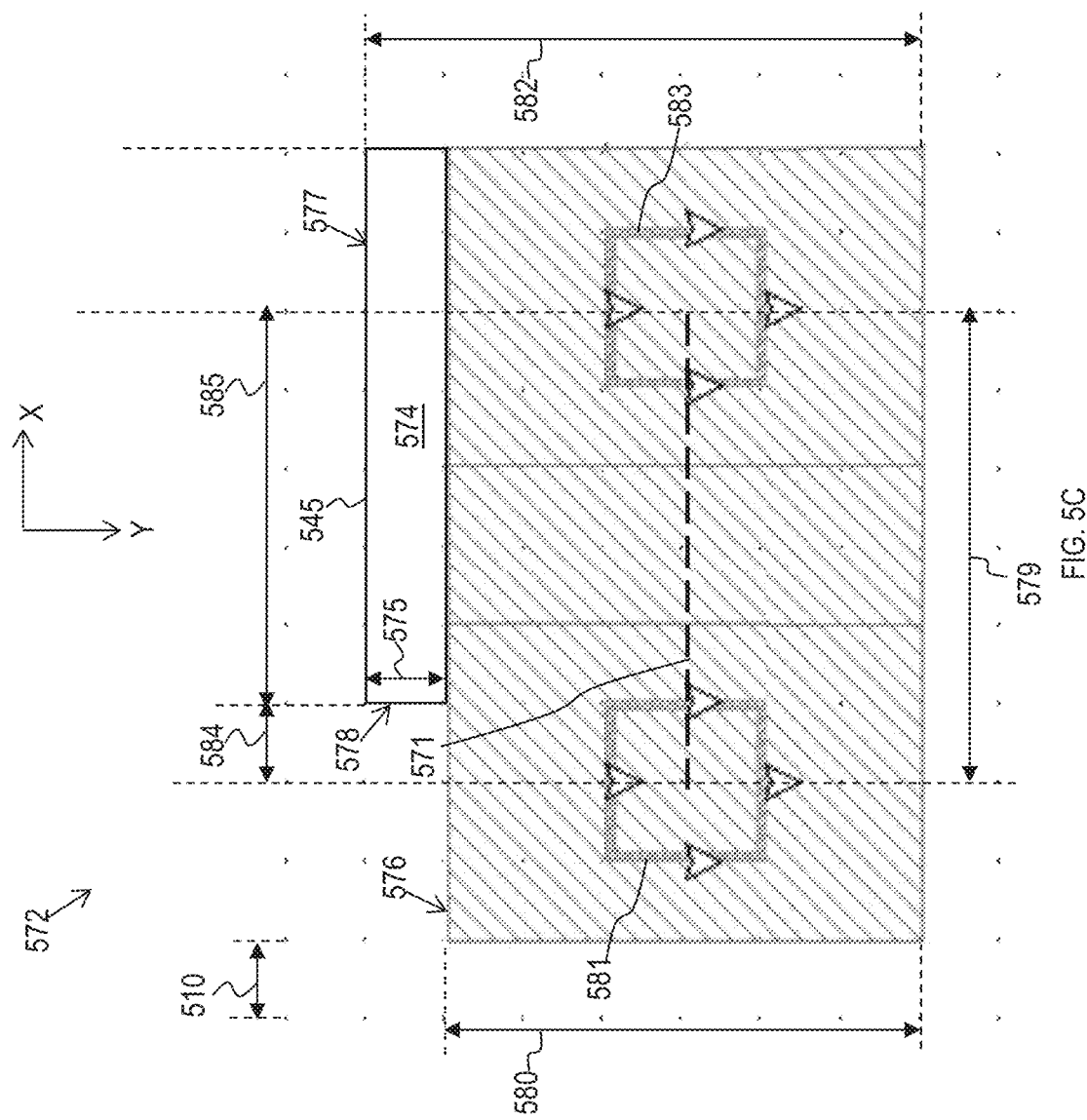

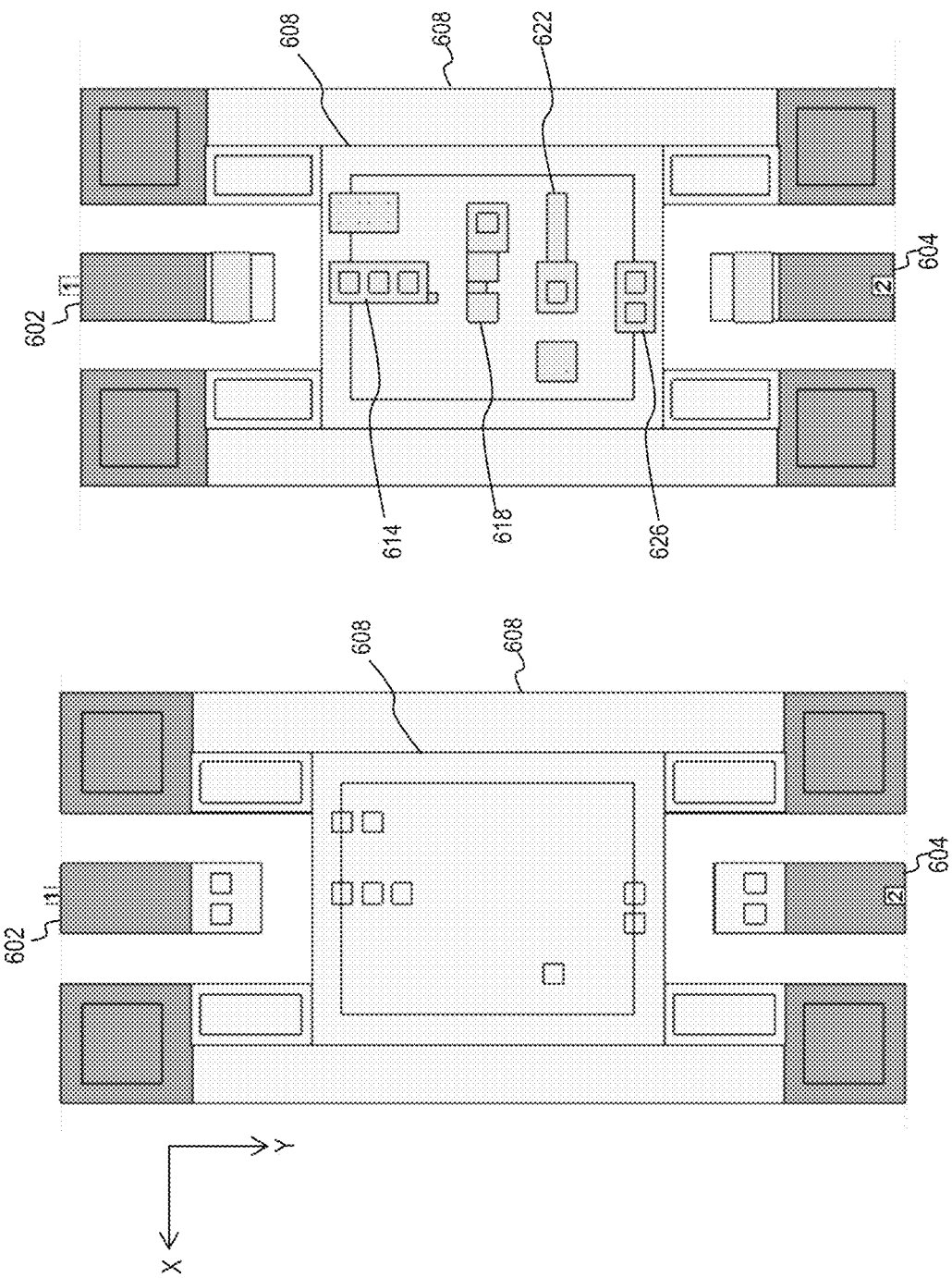

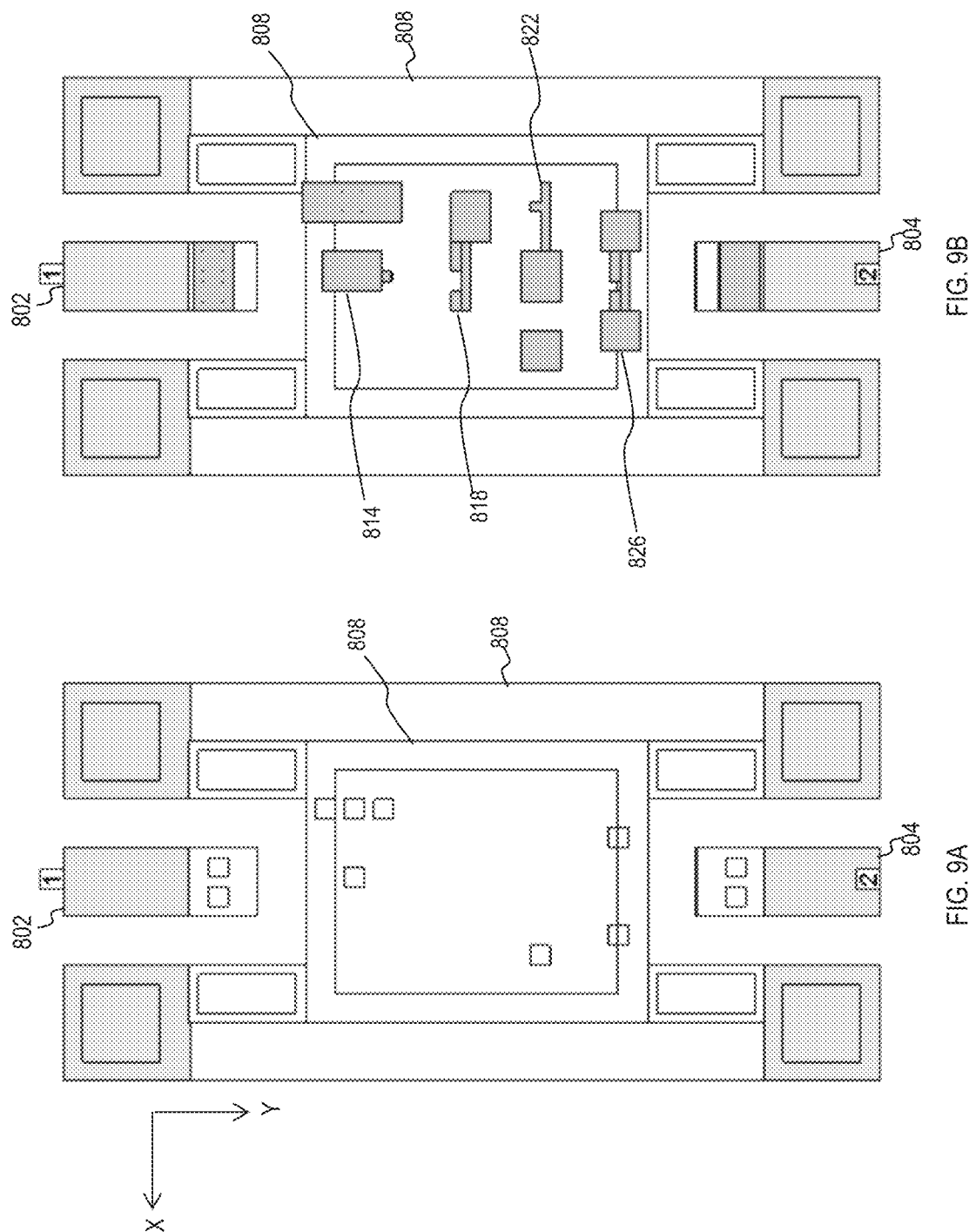

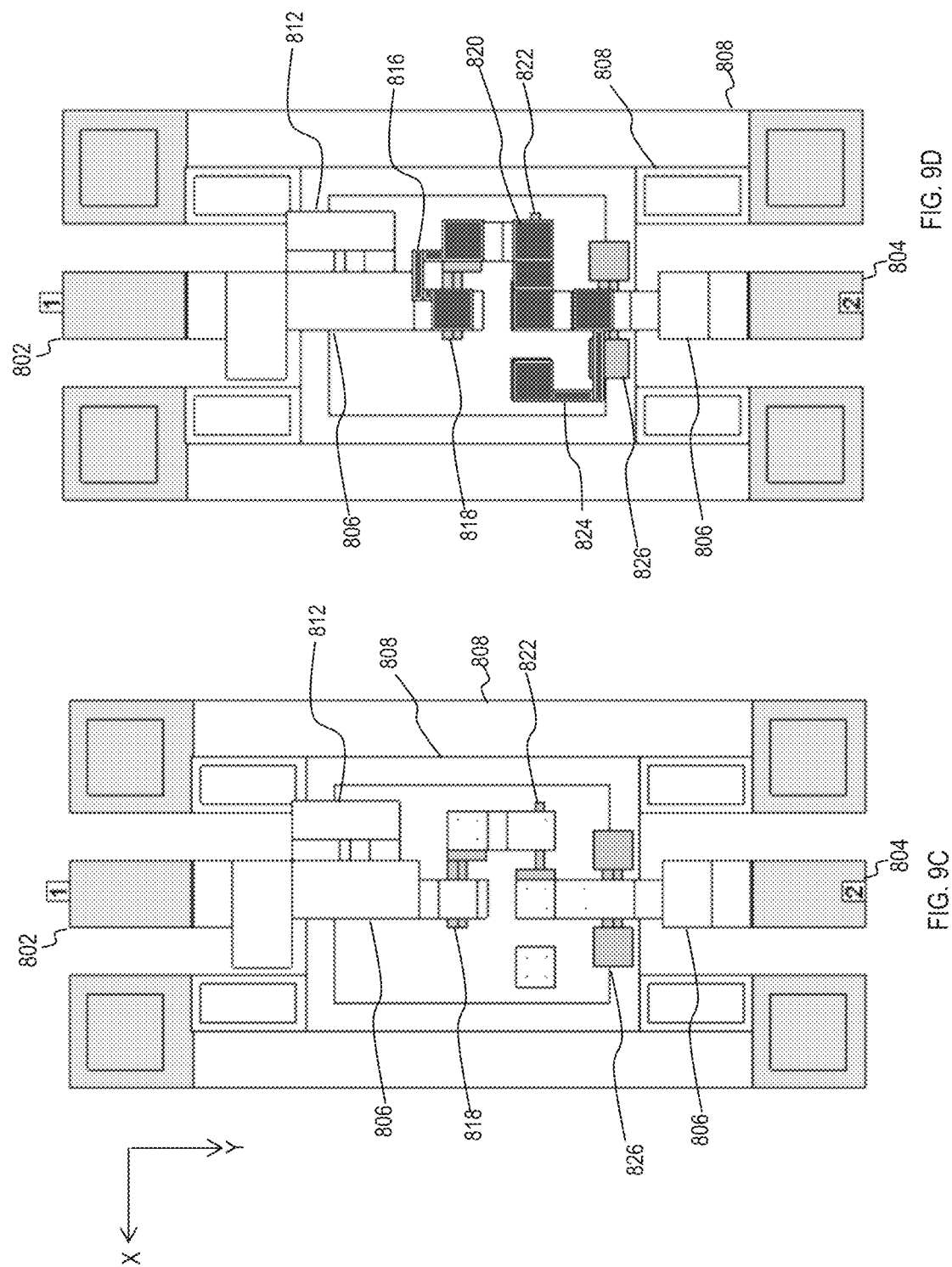

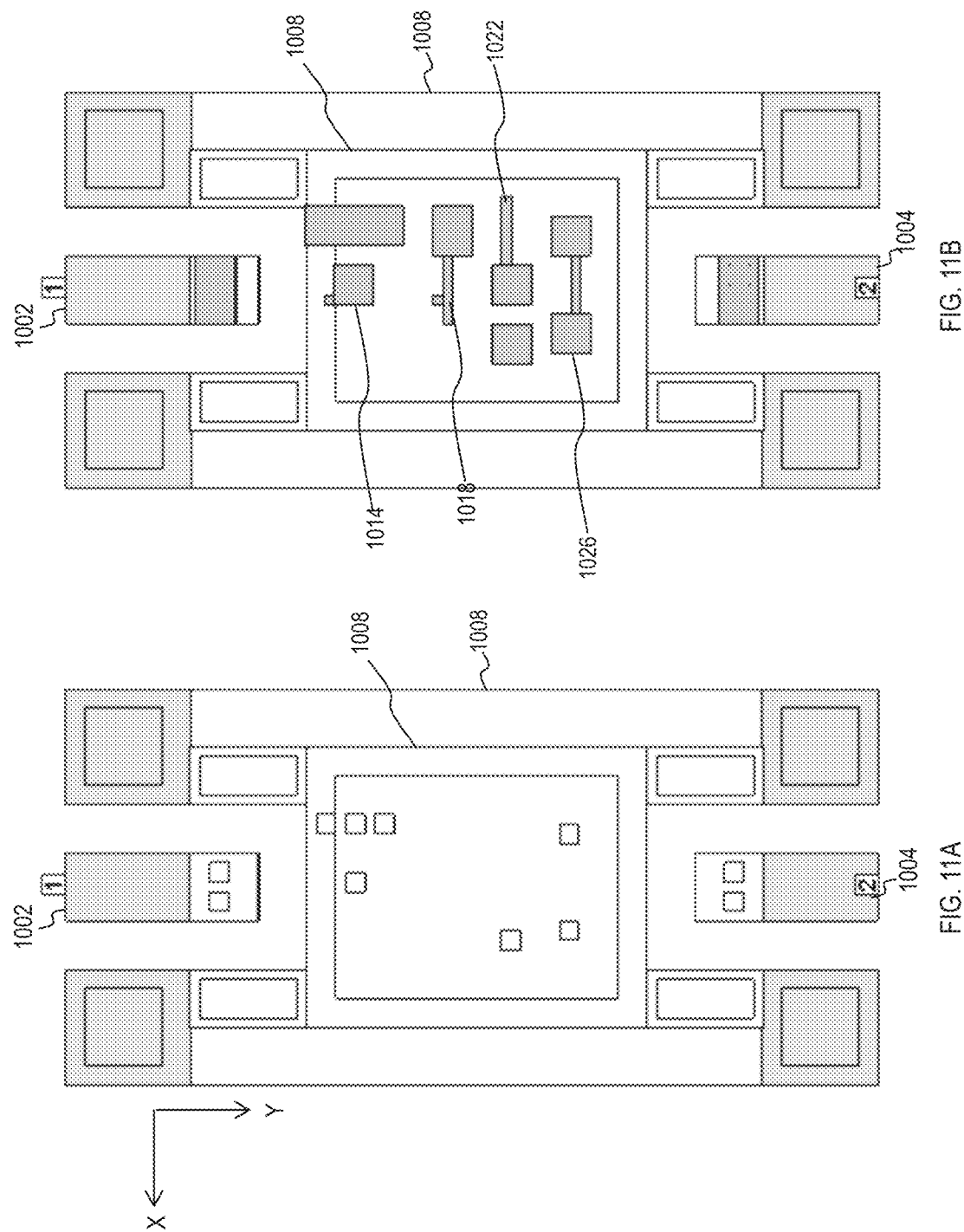

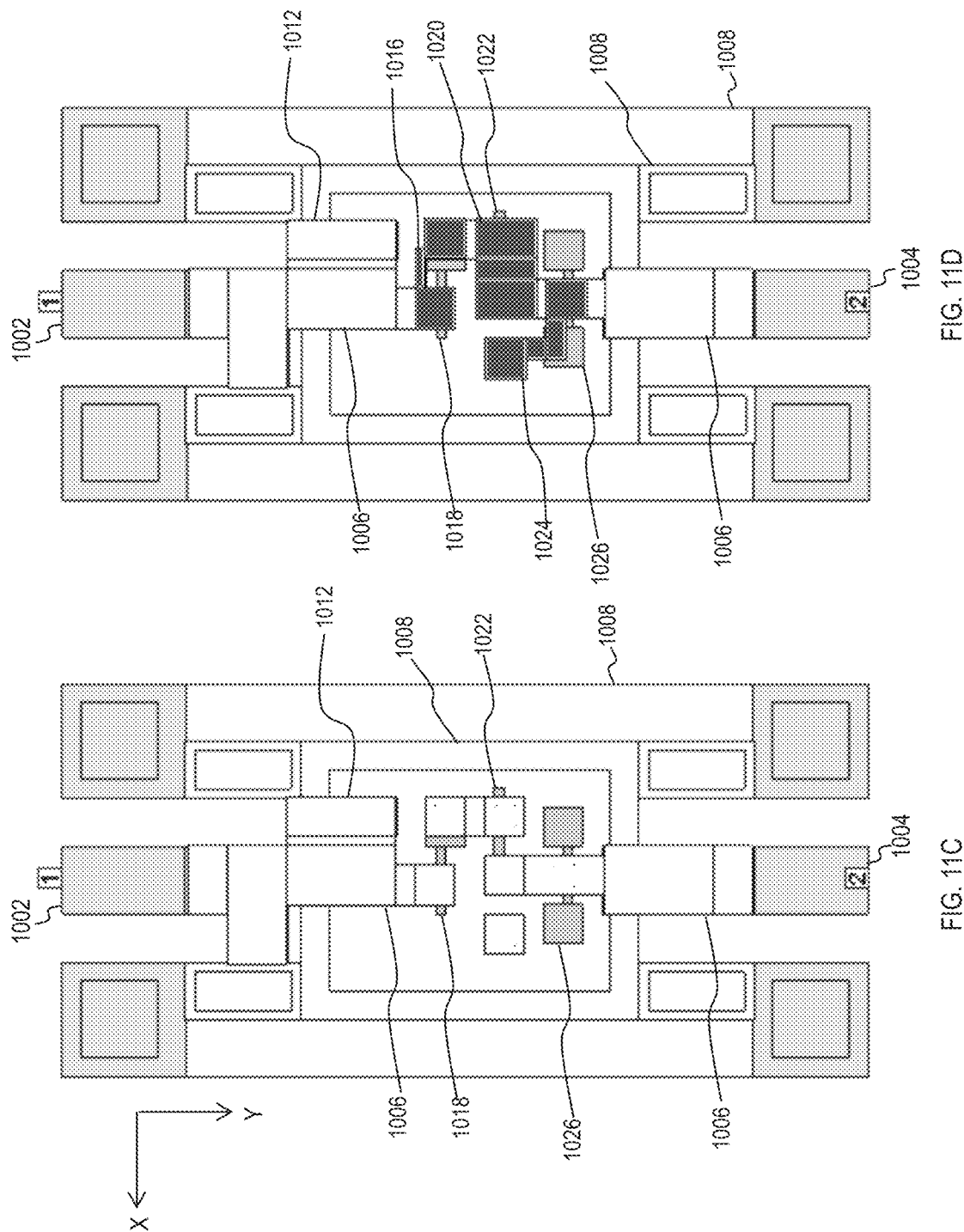

MULTILAYER ELECTRONIC DEVICE INCLUDING A HIGH PRECISION INDUCTOR

RELATED APPLICATIONS

The present application claims priority to U.S. Provisional Applications Ser. Nos. 62/782,501, filed on Dec. 20, 2018 and 62/850,106, filed on May 20, 2019, which are incorporated herein in their entirety by reference thereto.

BACKGROUND OF THE DISCLOSURE

Multilayer electronic devices often include inductors. For example, multilayer filters often include one or more inductors that are designed to provide specific inductance values. However, precision control over the inductance of such inductors can be difficult to achieve as it involves precisely controlling the dimensions of the inductor.

Filtering of high frequency signals, such as high frequency radio signal communication, has recently increased in popularity. The demand for increased data transmission speed for wireless connectivity has driven demand for high frequency components, including those configured to operate at high frequencies, including 5G spectrum frequencies. High frequency applications often require inductors having very low, yet precise inductance values. Achieving smaller inductance values requires smaller inductors, further increasing the difficulty associated with precisely controlling the inductance values. As such, a multilayer filter including a high precision inductor would be welcomed in the art.

SUMMARY OF THE DISCLOSURE

In accordance with one embodiment of the present disclosure, a multilayer electronic device may include a plurality of dielectric layers and a signal path having an input and an output. The multilayer electronic device may include an inductor including a conductive layer overlying one of the plurality of dielectric layers. The inductor may be electrically connected at a first location with the signal path and electrically connected at a second location with at least one of the signal path or a ground. The inductor may have an outer perimeter including a first straight edge that faces outward in a first direction and a second straight edge that is parallel to the first straight edge and faces outward in the first direction. The second straight edge may be offset from the first straight edge by an offset distance that is less than about 500 microns and less than about 90% of a first width of the inductor in the first direction at the first straight edge.

In accordance with another embodiment of the present disclosure, a method of forming a multilayer electronic device may include providing a plurality of dielectric layers and forming a plurality of conductive layers on at least some of the plurality of dielectric layers to form a signal path having an input and an output. The signal path may include an inductor electrically connected at a first location with the signal path and electrically connected at a second location with at least one of the signal path or a ground. The inductor may have an outer perimeter including a first straight edge that faces outward in a first direction and a second straight edge that is parallel to the first straight edge and faces outward in the first direction. The second straight edge may be offset from the first straight edge by an offset distance that is less than about 500 microns and less than about 90% of a first width of the inductor in the first direction at the first straight edge.

In accordance with another embodiment of the present disclosure, a method of designing an inductor for a multilayer electronic device may include selecting an effective length and a width for the inductor based on a target inductance value for the inductor. The method may include sizing an offset distance associated with a protrusion of the inductor. The offset distance may be between a first straight edge of a perimeter of the inductor and a second straight edge of the perimeter of the inductor. The offset distance may be less than 500 microns and less than about 90% of a first width of the inductor in a first direction at the first straight edge. The first straight edge may face outward in a first direction, and the second straight edge may be parallel with the first straight edge and may face outward in the first direction.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figures, in which:

FIGS. 4A through 4E are a series of sequential top down views of the filter of the filter of FIGS. 3A and 3B in which an additional layer is shown in each sequential figure;

FIG. 5C is a top down view of an embodiment of an inductor including a protrusion according to aspects of the present disclosure;

FIGS. 7A through 7D are a series of sequential top down views of the filter of FIGS. 6A and 6B in which an additional layer is shown in each sequential figure;

FIGS. 9A through 9D are a series of sequential top down views of the filter of FIGS. 8A and 8B in which an additional layer is shown in each sequential Figure;

FIGS. 11A through 11D are a series of sequential top down views of the filter of FIGS. 10A and 10B in which an additional layer is shown in each sequential figure;

Figure 1:
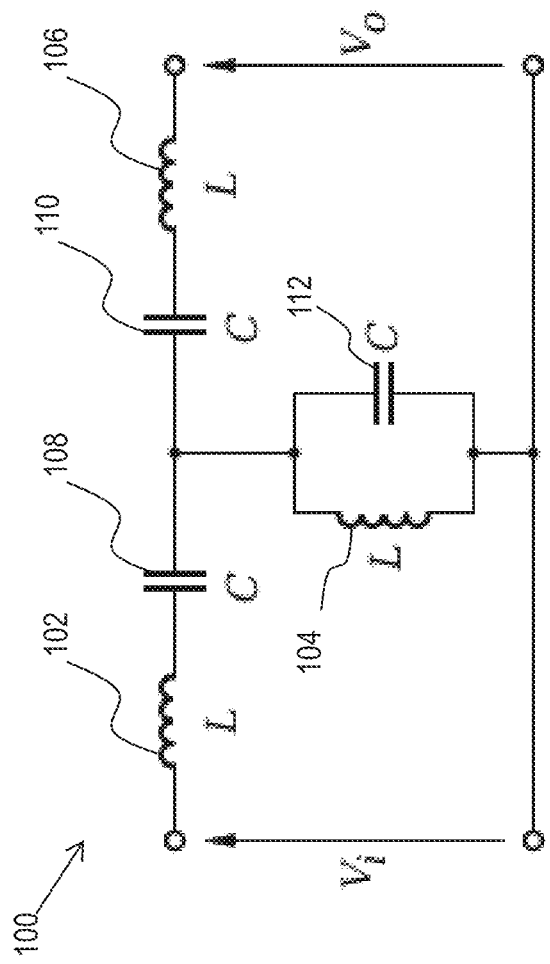
FIG. 1 is a simplified schematic of a band pass filter according to aspects of the present disclosure.

Repeat use of reference characters in the present specification and drawings is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Generally speaking, the present disclosure is directed to a multilayer electronic device including a plurality of dielectric layers and a signal path having an input and an output. The multilayer electronic device includes an inductor that includes a conductive layer formed on one of the plurality of dielectric layers. The inductor may be electrically connected at a first location with the signal path and electrically connected at a second location with at least one of the signal path or a ground.

The inductor may have an outer perimeter including a first straight edge that faces outward in a first direction and a second straight edge that is parallel to the first straight edge and faces outward in the first direction. The second straight edge may be offset from the first straight edge by an offset distance that is less than about 500 microns and less than about 90% of a first width of the inductor in the first direction at the first straight edge.

A protrusion may be associated with the offset distance. The protrusion may slightly increase the average width of the inductor and decreases the inductance of the inductor. Inductance is generally proportional to the length of an inductor, but inversely proportional to a width of the inductor. In other words, inductance may be proportional to a length-to-average-width ratio of the inductive element. As such, small adjustments to the width and length of inductive elements can be used to fine tune inductance. Thus, such protrusions may provide a more precise adjustment to the inductance of the inductor than adjusting the entire width of the inductor.

The multilayer filter may include one or more dielectric materials. In some embodiments, the one or more dielectric materials may have a low dielectric constant. The dielectric constant may be less than about 100, in some embodiments less than about 75, in some embodiments less than about 50, in some embodiments less than about 25, in some embodiments less than about 15, and in some embodiments less than about 5. For example, in some embodiments, the dielectric constant may range from about 1.5 and 100, in some embodiments from about 1.5 to about 75, and in some embodiments from about 2 to about 8. The dielectric constant may be determined in accordance with IPC TM-650 2.5.5.3 at an operating temperature of 25° C. and frequency of 1 MHz. The dielectric loss tangent may range from about 0.001 to about 0.04, in some embodiments from about 0.0015 to about 0.0025.

In some embodiments, the one or more dielectric materials may include organic dielectric materials. Example organic dielectric include polyphenyl ether (PPE) based materials, such as LD621 from Polyclad and N6000 series from Park/Nelco Corporation, liquid crystalline polymer (LCP), such as LCP from Rogers Corporation or W. L. Gore & Associates, Inc., hydrocarbon composites, such as 4000 series from Rogers Corporation, and epoxy-based laminates, such as N4000 series from Park/Nelco Corp. For instance, examples include epoxy based N4000-13, bromine-free material laminated to LCP, organic layers with high K material, unfilled high-K organic layers, Rogers 4350, Rogers 4003 material, and other thermoplastic materials such as polyphenylene sulfide resins, polyethylene terephthalate resins, polybutylene terephthalate resins, polyethylene sulfide resins, polyether ketone resins, polytetraflouroethylene resins and graft resins, or similar low dielectric constant, low-loss organic material.

In some embodiments, the dielectric material may be a ceramic-filled epoxy. For example, the dielectric material may include an organic compound, such as a polymer (e.g., an epoxy) and may contain particles of a ceramic dielectric material, such as barium titanate, calcium titanate, zinc oxide, alumina with low-fire glass, or other suitable ceramic or glass-bonded materials.

Other materials may be utilized, however, including, N6000, epoxy based N4000-13, bromine-free material laminated to LCP, organic layers with high K material, unfilled high-K organic layers, Rogers 4350, Rogers 4003 material (from the Rogers Corporation), and other thermoplastic materials such as hydrocarbon, Teflon, FR4, epoxy, polyamide, polyimide, and acrylate, polyphenylene sulfide resins, polyethylene terephthalate resins, polybutylene terephthalate resins, polyethylene sulfide resins, polyether ketone resins, polytetraflouroethylene resins, BT resin composites (e.g., Speedboard C), thermosets (e.g., Hitachi MCL-LX-67F), and graft resins, or similar low dielectric constant, low-loss organic material.

Additionally, in some embodiments, non-organic dielectric materials may be used including a ceramic, semi-conductive, or insulating materials, such as, but not limited to barium titanate, calcium titanate, zinc oxide, alumina with low-fire glass, or other suitable ceramic or glass-bonded materials. Alternatively, the dielectric material may be an organic compound such as an epoxy (with or without ceramic mixed in, with or without fiberglass), popular as circuit board materials, or other plastics common as dielectrics. In these cases, the conductor is usually a copper foil which is chemically etched to provide the patterns. In still further embodiments, dielectric material may comprise a material having a relatively high dielectric constant (K), such as one of NPO (COG), X7R, X5R X7S, ZSU, Y5V and strontium titanate. In such examples, the dielectric material may have a dielectric constant that is greater than 100, for example within a range from between about 100 to about 4000, in some embodiments from about 1000 to about 3000.

One or more conductive layers may be directly formed on the dielectric layers. Alternatively a coating or intermediate layer may be located between the conductive layers and respective dielectric layers. As used herein, "formed on" may refer to either a conductive layer that is directly formed on a dielectric layer or a conductive layer that overlies the dielectric layer with an intermediate layer or coating therebetween.

The conductive layers may include a variety of conductive materials. For example, the conductive layers may include copper, nickel, gold, silver, or other metals or alloys.

In some embodiments, the multilayer electronic device may include a signal path having an input and an output. The signal path may include one or more conductive layers overlying one or more of the dielectric layers and connected with one or more vias.

Vias may be formed in one or more of the dielectric layers. For example, a via may electrically connect a conductive layer on one dielectric layer with a conductive layer on another dielectric layer. The via may include a variety of conductive materials, such as copper, nickel, gold, silver, or other metals or alloys. The vias may be formed by drilling (e.g., mechanical drilling, laser drilling, etc.) through holes and plating the through holes with a conductive material, for example using electroless plating or seeded copper. The vias may be filled with conductive material such that a solid column of conductive material is formed. Alternatively, the interior surfaces of the through holes may be plated such that the vias are hollow.

The multilayer electronic device may include an inductor. The inductor may include a conductive layer formed on one of the plurality of dielectric layers. The inductor may be electrically connected at a first location with the signal path and electrically connected at a second location with at least one of the signal path or a ground. For example, the inductor may form a portion of the signal path or may be connected between the signal path and ground.

In some embodiments, the inductor may include at least one corner. The corner may have an angle greater than about 20 degrees, (e.g., 90 degrees). The inductor may have from one to nine corners, or more, in some embodiments, the inductor may have fewer than six corners, in some embodiments fewer than four corners, in some embodiments fewer than three corners, and in some embodiments fewer than two corners. In some embodiments, the inductor may be free of any corners. In some embodiments, the inductor may define a full "loop" or less. For example, the inductor may define less than one half of a "loop."

In some embodiments, at least some of the dielectric layers may have thicknesses that are less than about 180 microns, in some embodiments less than about 120 microns, in some embodiments less than about 100 microns in some embodiments less than about 80 microns, in some embodiments less than 60 microns, in some embodiments less than about 50 microns, in some embodiments less than about 40 microns, in some embodiments less than about 30 microns, and in some embodiments less than about 20 microns. For example, the conductive layer of the inductor may be formed on a dielectric layer having a thickness that is less than about 180 microns, in some embodiments less than about 100 microns, and in some embodiments less than about 80 microns.

One or more vias may be formed in the dielectric layers. The via(s) may electrically connect the different conductive layers. For example, a via may be formed in the dielectric layer on which the conductive layer of the inductor is formed. Such via may connect the inductor with another part of the filter, such as a portion of the signal path or the ground (e.g., a ground plane). In some embodiments, the length of such via in a Z-direction may be equal to the thickness of the dielectric layer in which such via is formed. For example, such via may have a length that less than about 180 microns, in some embodiments less than about 100 microns, and in some embodiments less than about 80 microns.

In some embodiments, a series of vias and intermediary layers may be vertically arranged to connect the inductor with another conductive layer, such as the ground plane or a portion of the signal path. A total vertical length in the Z-direction of the series of vias and intermediary layers may range from about 10 microns to about 500 microns, in some embodiments from about 30 microns to about 300 microns, in some embodiments from about 40 microns to about 200 microns, and in some embodiments from about 60 microns to about 150 microns.

The via(s) may have a variety of suitable widths. For example, in some embodiments the width of the via may range from about 20 microns to about 200 microns, in some embodiments from about 40 microns to about 180 microns, in some embodiments from about 60 microns to about 140 microns, and in some embodiments from about 80 microns to about 120 microns.

In some embodiments, the multilayer electronic device may be configured as a multilayer filter. The multilayer filter may be configured for operation at high frequencies. The multilayer filter may have a characteristic frequency (e.g., a low pass frequency, a high pass frequency, an upper bound of a bandpass frequency, or a lower bound of the bandpass frequency) that is greater than 6 GHz. In some embodiments, the filter may have a characteristic frequency that is greater than about 6 GHz, in some embodiments greater than about 10 GHz, in some embodiments greater than about 15 GHz, in some embodiments greater than about 20 GHz, in some embodiments greater than about 25 GHz, in some embodiments greater than about 30 GHz, in some embodiments greater than about 35 GHz, in some embodiments greater than about 40 GHz, in some embodiments greater than about 45 GHz, in some embodiments greater than about 50 GHz, in some embodiments greater than about 60 GHz, in some embodiments greater than about 70 GHz, and in some embodiments in some embodiments greater than about 80 GHz.

The multilayer filter may exhibit excellent performance characteristics, such as low insertion loss for frequencies within a pass band frequency range of the multilayer filter. For example, the average insertion loss for frequencies within the pass band frequency range may be greater than −15 dB, in some embodiments greater than −10 dB, in some embodiments greater than −5 dB, in some embodiments greater than −2.5 dB or more.

Additionally, the multilayer filter may exhibit excellent rejection of frequencies outside the pass band frequency range. In some embodiments, the insertion loss for frequencies outside the pass band frequency range may be less than about −15 dB, in some embodiments less than about −25 dB, in some embodiments less than about −35 dB, and in some embodiments less than about −40 dB.

Additionally, the multilayer filter may exhibit steep roll-off from the passband frequency range to frequencies outside the passband. For example, for frequencies immediately outside the passband frequency range, the insertion loss may decrease at a rate of about 0.1 dB/MHz, in some embodiments greater than about 0.2 dB/MHz, in some embodiments greater than about 0.3 dB/MHz, and in some embodiments greater than about 0.4 dB/MHz.

The multilayer filter may also exhibit consistent performance characteristics (e.g., insertion loss, return loss, etc.) across a wide range of temperatures. In some embodiments, the insertion loss of the multilayer filter may vary less than 5 dB or less across large temperature ranges. For example, the multilayer filter can exhibit a first insertion loss at about 25° C. and at a first frequency. The multilayer filter can exhibit a second insertion loss at a second temperature and at about the first frequency. A temperature difference between the first temperature and the second temperature can be about 70° C. or greater, in some embodiments about 60° C. or greater, in some embodiments about 50° C. or greater, in some embodiments about 30° C. or greater, and in some embodiments about 20° C. or greater. As an example, the first temperature can be 25° C., and the second temperature can be 85° C. As another example, the first temperature can be 25° C., and the second temperature can be −55° C. The difference between the second insertion loss and the first insertion loss can be about 5 dB or less, in some embodiments about 2 dB or less, in some embodiments about 1 dB or less, in some embodiments, about 0.75 dB or less, in some embodiments about 0.5 dB or less, and in some embodiments, about 0.2 dB or less.

However, it should be understood that in other embodiments, the multilayer electronic device may be any suitable type of device that includes an inductor. For example the multilayer electronic device may be a multilayer inductor, multilayer inductor array, multilayer transformer (e.g., a balun), etc.

In some embodiments, the device may have an overall length that ranges from about 0.5 mm to about 30 mm, in some embodiments, from about 1 mm to about 15 mm, and in some embodiments from about 2 mm to about 8 mm.

In some embodiments, the device may have an overall width that ranges from about 0.2 mm to about 20 mm, in some embodiments from about 0.5 mm to about 15 mm, in some embodiments from about 1 mm to about 10 mm, and in some embodiments from about 2 mm to about 8 mm.

The device may generally be low-profile or thin. For example, in some embodiments, the device may have an overall thickness that ranges from about 100 microns to about 2 mm, in some embodiments from about 150 microns to about 1 mm, and in some embodiments from about 200 microns to about 300 microns.

Regardless of the particular configuration employed, the present inventors have discovered that through selective control over the shape of conductive layers of an inductor of a multilayer electronic device, precise control over the inductance of the inductor can be achieved. More specifically, an average width of the inductor may be precisely adjusted using one or more protrusions. The protrusions may provide excellent control over a length-to-average-width ratio of the inductor, which allows precise control of the inductance value of the inductor.

The multilayer electronic device may include conductive layers. The conductive layers may be formed using a variety of suitable techniques. Subtractive, semi-additive or fully additive processes may be employed with panel or pattern electroplating of the conductive material followed by print and etch steps to define the patterned conductive layers. Photolithography, plating (e.g., electrolytic), sputtering, vacuum deposition, printing, or other techniques may be used to for form the conductive layers. For example, a thin layer (e.g., a foil) of a conductive material may be adhered (e.g., laminated) to a surface of a dielectric layer. The thin layer of conductive material may be selectively etched using a mask and photolithography to produce a desired pattern of the conductive material on the surface of the dielectric material.

A finite resolution is achievable for any such process. A "minimum line width" may be defined as the smallest, accurately producible feature size of the process employed. In some embodiments, the minimum line width may be about 100 microns or less, in some embodiments about 75 microns or less, in some embodiments about 50 microns or less, in some embodiments about 20 microns or less, in some embodiments about 10 microns or less, and in some embodiments about 5 microns or less. A "minimum area unit" may be defined as the minimum line width squared. The minimum area unit may be about 0.01 $mm^2$ or less, in some embodiments about 0.005 $mm^2$ or less, in some embodiments about 0.0025 $mm^2$ or less, and in some embodiments about 0.0001 $mm^2$ or less.

In some embodiments, inductors that are short and/or wide may be employed to achieve very low inductance values. Such low inductance values may be desirable for high frequency applications. A length-to-average-width ratio may be defined as the length of the inductor divided by an average width of the inductor. In some embodiments, the length-to-average-width ratio may be less than about 60, in some embodiments less than about 20, in some embodiments less than about 10, in some embodiments less than about 8, in some embodiments, less than about 6, in some embodiments less than about 4, in some embodiments less than about 2, in some embodiments less than about 1, and in some embodiments less than about 0.5.

The inductor may have an average width that is less than about 1000 microns, in some embodiments less than about 500 microns, in some embodiments less than about 300 microns, in some embodiments less than about 200 microns, and in some embodiments less than about 100 microns.

In some embodiments, the inductor may have an effective length between the first location and the second location. The effective length may be defined as the length along the conductive layer between the first location and the second location. For example, the effective length may equal a sum of lengths of various straight portions of the inductor (e.g., in the X-Y plane) connected between the first location and the second location. The effective length of the inductor may be less than about 5 mm, in some embodiments less than about 3 mm, in some embodiments less than about 2 mm, in some embodiments less than about 1 mm, in some embodiments less than about 800 microns, in some embodiments less than about 500 microns, in some embodiments less than about 300 microns, in some embodiments less than about 200 microns, and in some embodiments less than about 100 microns.

The inductor may include a feature (e.g., a protrusion) that slightly increases the width of the inductor, which may slightly decrease the inductance of the inductor. More specifically, the inductor may have an outer perimeter that includes a first straight edge that faces outward in a first direction and a second straight edge that is parallel to the first straight edge and faces outward in the first direction. The second straight edge may be offset from the first straight edge by an offset distance. The protrusion may be formed by the second straight edge being offset from the first straight edge.

The offset distance may be less than about 500 microns, in some embodiments less than about 400 microns, in some embodiments less than about 300 microns, in some embodiments less than about 200 microns, in some embodiments less than about 100 microns, in some embodiments less than about 75 microns, and in some embodiments less than about 50 microns. The offset distance may be about 8 minimum line widths or less, in some embodiments about 4 minimum line widths or less, in some embodiments about 2 minimum line widths or less, and in some embodiments approximately 1 minimum line width.

The offset distance may be about 90 percent or less of a first width of the inductor in the first direction at the first straight edge, in some embodiments 80 percent or less, in some embodiments 70 percent or less, in some embodiments 60 percent or less, in some embodiments, in some embodiments 50 percent or less, 40 percent or less, in some embodiments 30 percent or less, in some embodiments 20 percent or less, in some embodiments 10 percent or less, in some embodiments 5 percent or less, and in some embodiments 2 percent or less. The protrusion may decrease the length-to-average-width ratio of the inductor by 30 percent or less, in some embodiments by 20 percent or less, in some embodiments by 10 percent or less, in some embodiments by 5 percent or less, and in some embodiments by 2 percent or less.

Thus, a ratio of the second width of the inductor at the second straight edge to the first width of the inductor at the first straight edge may be less than about 1.9, in some embodiments less than about 1.8, in some embodiments less than about 1.7, in some embodiments less than about 1.6, in some embodiments less than about 1.5, in some embodiments less than about 1.4, in some embodiments less than about 1.3, in some embodiments less than about 1.2, in some embodiments less than about 1.1, in some embodiments less than about 1.05, and in some embodiments less than about 1.02. In some embodiments the ratio of the second width of the inductor at the second straight edge to the first width of the inductor at the first straight edge may be greater than about 1.02, in some embodiments greater than about 1.05, in some embodiments greater than about 1.1, in some embodiments greater than about 1.2. Such dimensions may allow the protrusion to fine tune the width of the inductor at the protrusion and thereby fine tune the inductance of the inductor.

In some embodiments, the protrusion or tab may have an effective length of about 70 microns or more, in some embodiments greater than about 100 microns, in some embodiments greater about 120 microns, in some embodiments greater than about 150 microns, in some embodiments greater about 200 microns, and in some embodiments greater than about 220 microns.

In some embodiments, the inductor may include multiple protrusions. For example, the inductor may include a pair of protrusions. The pair of protrusions may be symmetric about a centerline of the inductor that extends from the first location to the second location along the inductor. In some embodiments, the pair of protrusions may be symmetric about a lateral centerline.

A width discontinuity edge may extend between the first straight edge and the second straight edge. The width discontinuity edge may be perpendicular to the first straight edge and second straight edge. The width discontinuity edge may be spaced apart from a corner of a longitudinal centerline of the inductor by at least about 30 microns, in some embodiments at least 50 microns, in some embodiments at least 80 microns, in some embodiments at least 100 microns, in some embodiments at least 200 microns, in some embodiments at least 300 microns, n some embodiments at least 500 microns.

I. Multilayer Filter

FIG. 1 is a simplified schematic of a multilayer filter 100 according to aspects of the present disclosure. The filter 100 may include one or more inductors 102, 104, 106, and one or more capacitors 108, 110, 112. An input voltage (represented by $V_i$ in FIG. 1) may be input to the filter 100, and an output voltage (represented by $V_o$ in FIG. 1) may be output by the filter 100. The band pass filter 100 may significantly reduce low and high frequencies while allowing frequencies within a passband frequency range to be transmitted through the filter 100 substantially unaffected. It should be understood that the simplified filter 100 described above is merely a simplified example of a band pass filter and that aspects of the present disclosure may be applied to more complex band pass filters. Additionally, aspects of the present disclosure may be applied to other types of filters, including, for example, a low-pass filter or a high-pass filter.

Figure 2:
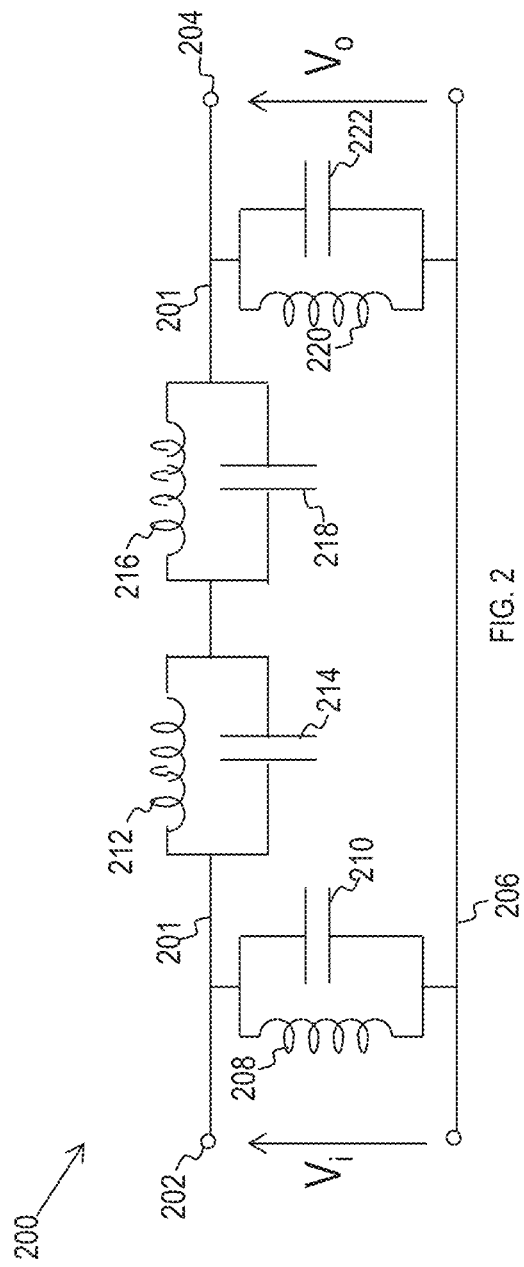
FIG. 2 is a simplified schematic of another band pass filter according to aspects of the present disclosure.

FIG. 2 is a schematic of an example embodiment of a band pass filter 200 according to aspects of the present disclosure. A signal path 201 may be defined between an input 202 and an output 204 of the filter 200. An input voltage (represented by V; in FIG. 1) may be input to the filter 200 between the input 202 and a ground 206 of the filter 200. An output voltage (represented by $V_o$ in FIG. 1) may be output by the filter 200 between the output 204 and the ground 206.

The filter 200 may include a first inductor 208 and a first capacitor 210 electrically connected in parallel with each other. The first inductor 208 and first capacitor 210 may be electrically connected between the signal path 201 and the ground 206. The filter 200 may include a second inductor 212 and second capacitor 214 electrically connected in parallel with each other. The second inductor 212 and second capacitor 214 may be connected in series with the signal path 201 (e.g., may form a portion of the signal path 201). The filter 200 may include a third inductor 210 and third capacitor 214 electrically connected in parallel with each other. The third inductor 210 and third capacitor 214 may be electrically connected between the signal path 201 and the ground 206. The third inductor 210 and third capacitor 214 may be connected in series with the signal path 201 (e.g., may form a portion of the signal path 201). The filter 200 may include a fourth inductor 220 and fourth capacitor 222 electrically connected in parallel with each other. The fourth inductor 220 and fourth capacitor 222 may be electrically connected between the signal path 201 and the ground 206.

The inductance values of the inductors 208, 212, 216, 220 and the capacitance values of the capacitors 210, 214, 218, 222 may be selected to produce the desired band pass frequency range of the band pass filter 200. The band pass filter 200 may significantly reduce frequencies outside of the passband frequency range while allowing frequencies within a passband frequency range to be transmitted through the filter 200 substantially unaffected.

Figure 3A:
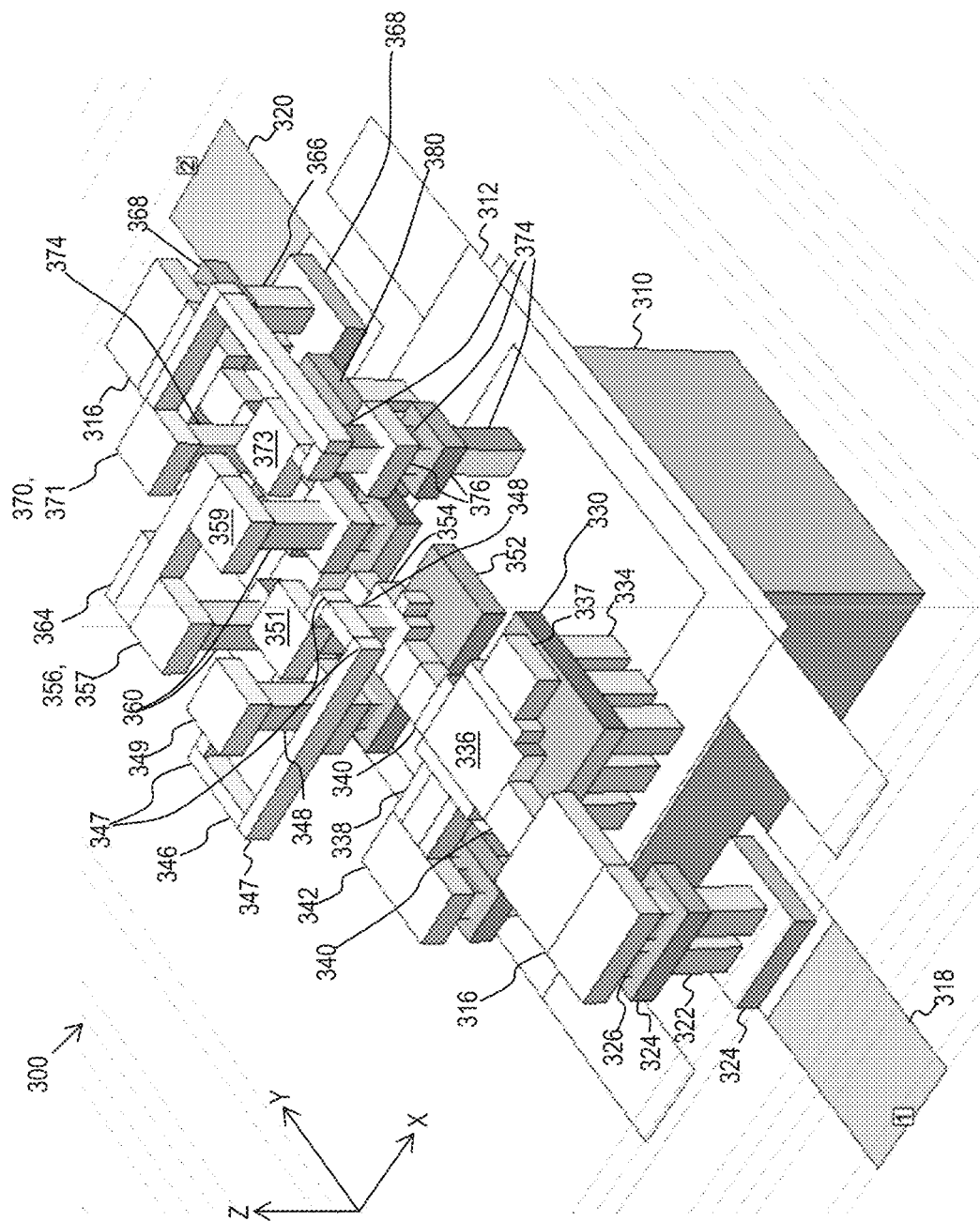
FIGS. 3A and 3B are perspective views of an example band pass filter according to aspects of the present disclosure.
Figure 3B:
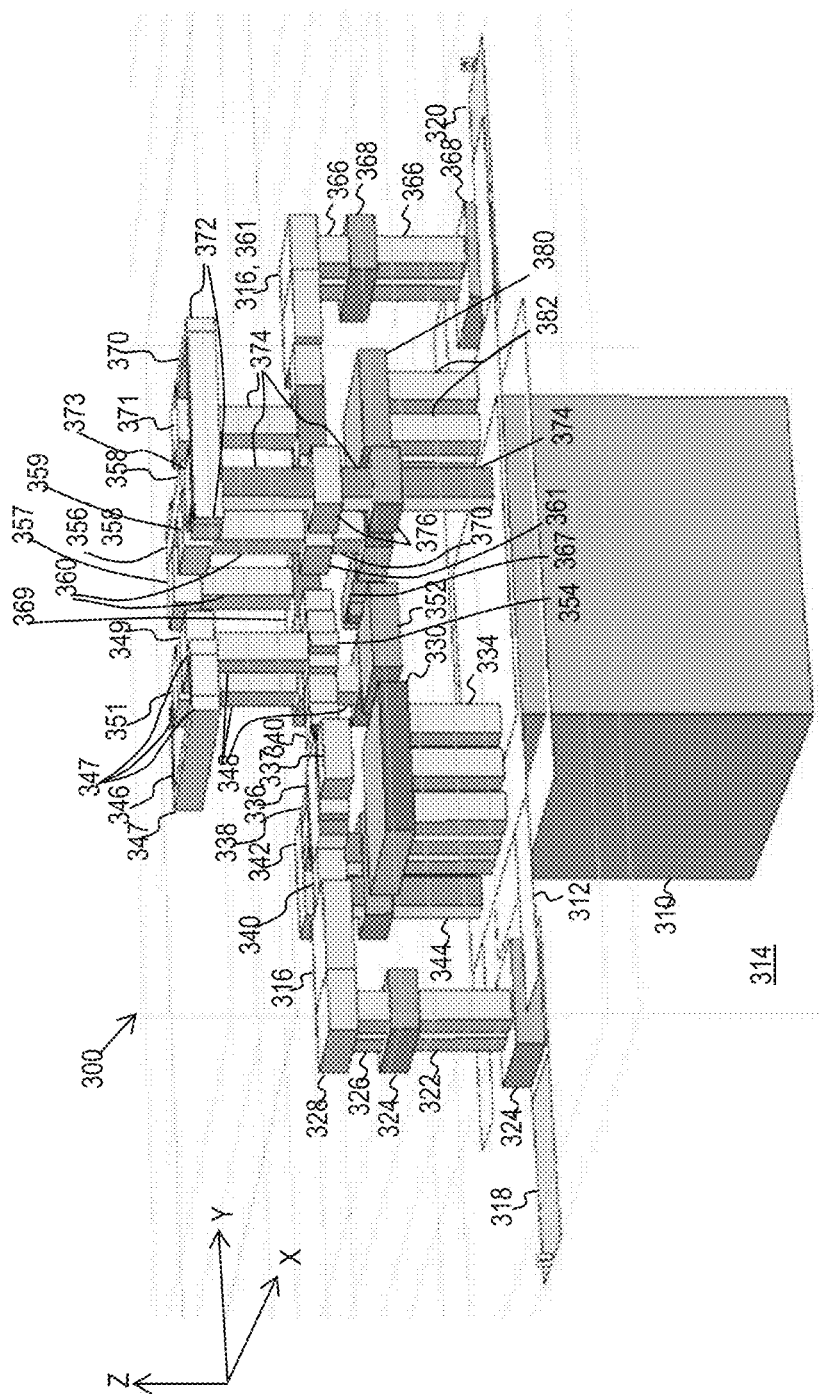
Figure 3C:
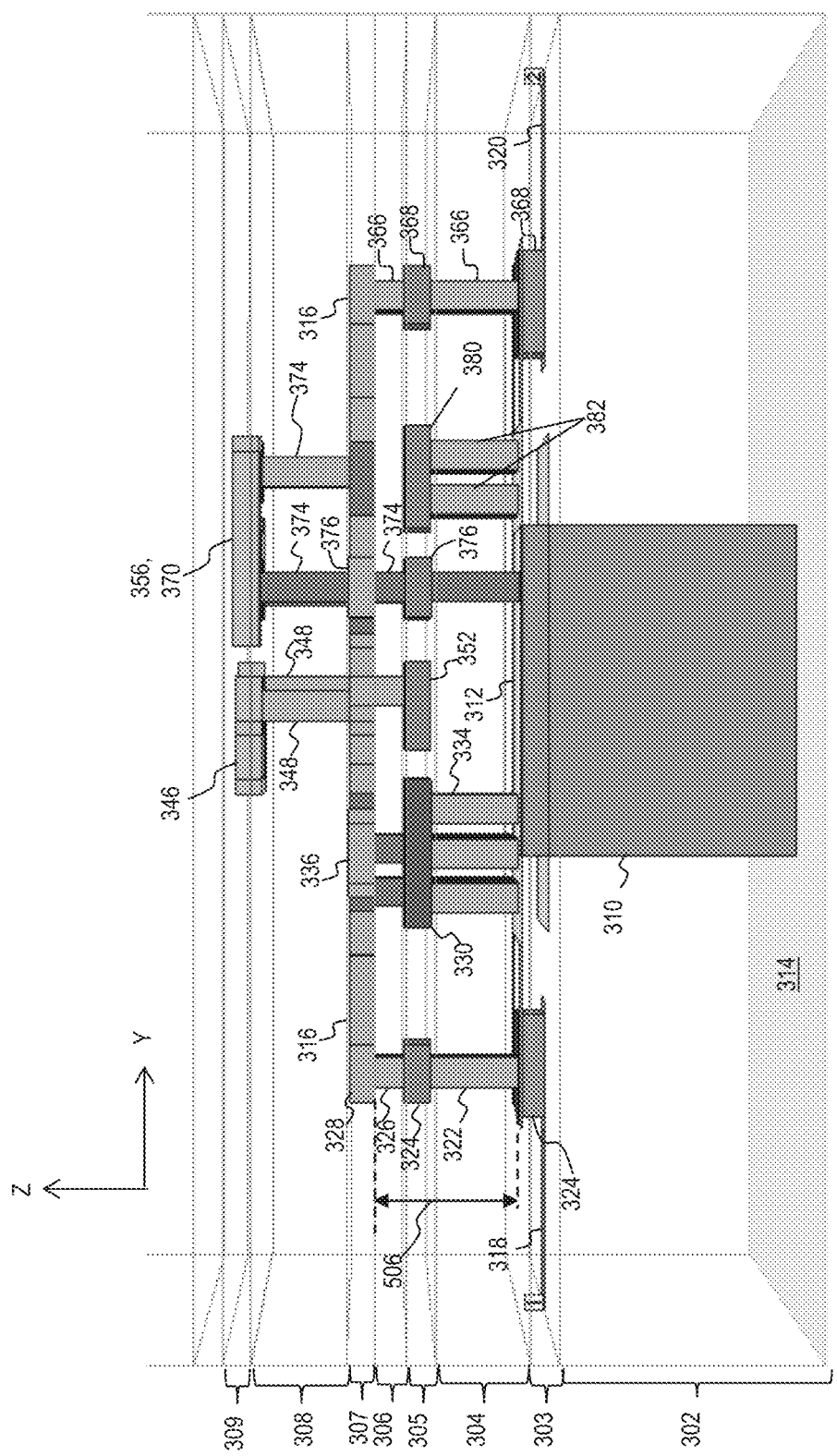
FIG. 3C is a side elevation view of the filter of FIGS. 3A and 3B.

FIGS. 3A and 3B are perspective views of an example band pass filter 300 according to aspects of the present disclosure. FIG. 3C is a side elevation view of the filter 300 of FIGS. 3A and 3B. Referring to FIGS. 3A through 3C, the band pass filter 300 may include a plurality of dielectric layers (transparent for clarity). Referring to FIG. 3C, a first dielectric layer 304, second dielectric layer 306, and third dielectric layer 308 may be stacked to form a monolithic structure. The filter 300 may be mounted to a mounting surface 302, such as a printed circuit board. Conductive layers 303, 305, 307, 309 may be formed on the dielectric layers 304, 306, 308. Conductive layer 303 may be formed on a bottom surface of the first dielectric layer 304. Conductive layers 305, 307 may be formed on a top surface and a bottom surface, respectively of the second dielectric layer 306. A ground may include a ground plane 312 that is exposed and/or terminated along a bottom surface of the filter 300 (the bottom surface of conductive layer 303. The mounting surface may include one or more terminals 310 for connection with the ground plane 312.

FIGS. 4A through 4E are a series of sequential top down views of the filter 300 in which an additional layer is shown in each Figure. More specifically, FIG. 4A illustrates the mounting surface 302 and the first conductive layer 303. FIG. 4B illustrates the ground plane 312 formed on the bottom surface of the first dielectric layer 304. FIG. 4C additionally illustrates the conductive layer 305 formed on the top surface of the first dielectric layer 304. FIG. 4D additionally illustrates conductive layer 307 that is formed on the second dielectric layer 306. FIG. 4E illustrates the conductive layer 309 formed on the third layer 308. The dielectric layers 304, 306, 308 are transparent to show the relative relocations of the various patterned conductive layers 303, 305, 307, 309.

The band pass filter 300 may include a signal path 316 having an input 318 and an output 320. The signal path 316 may electrically connect the input 318 and the output 320. More specifically, the signal path 316 may include a plurality of dielectric layers and/or vias formed in and on the plurality of dielectric layers 304, 306, 308 and electrically connected between the input 318 and the output 320. The signal path 316 may include one or more vias 322 may electrically connecting the input 318 with an intermediary conductive layer 324 disposed between the first layer 304 and second layer 306. The signal path 316 may include one or more vias 326 electrically connecting the intermediary layer 324 with a conductive layer 328 formed on the second dielectric layer 306.

A first capacitor may be formed between a portion 336 of the signal path 316 formed on an upper surface of the second layer 360 and a conductive layer 330 formed on a lower surface of the second layer 306 of dielectric material. The conductive layer 330 may be electrically connected with the ground plane 312. The first capacitor of the filter 300 may correspond with the first capacitor 210 of the circuit diagram 200 of FIG. 2. The conductive layer 330 may be capacitively coupled with a portion 336 of the signal path 316. The conductive layer 330 may be spaced apart from the portion 336 of the signal path 316 in a Z-direction. The conductive layer 330 may be electrically connected with the ground plane 312 by one or more vias 334.

The first capacitor may be insensitive to relative misalignment of the electrodes of the first capacitor, which may be described as being "self-aligning." As best seen in FIG. 4D, the portion 336 of the signal path 316 may generally be dimensionally smaller (e.g., in the X- and Y-directions) than the conductive layer 330 of the first capacitor. Additionally the portion 336 of the signal path 316 may define connections in the X-Y plane with other elements and other parts of the signal path 316. Such connections may be sized such that a slight misalignment in the X-direction or Y-direction does not change a capacitive area of the first capacitor. More specifically, a size of an effective overlap area (e.g., in the X-Y plane) between the conductive layer 330 and the portion 336 of the signal path 316 may be insensitive to slight misalignment in the X-direction or Y-direction of the second and third layers 304, 306.

For example, the portion 336 of the signal path 316 may include a tab 337 (e.g., extending in the X-direction) that has a width (e.g., in the Y-direction) equal to a width (e.g., in the Y-direction) of the connector portion 338 on an opposite side of the portion 336. Similarly, connections 340 may extend from opposite sides of the portion 336 (e.g., in the Y-direction) that may have equal widths. As a result, relative misalignment in the Y-direction may not alter the overlapping area between the conductive layer 330 and the portion 336 of the signal path 316.

The filter 300 may include a first inductor 342 electrically connected with the signal path 316 and ground plane 312. The first inductor 342 of the filter 300 may correspond with the first inductor 208 of the circuit diagram 200 of FIG. 2. The first inductor 342 may be connected with the portion 336 of the signal path 316 that forms the first capacitor by a connector portion 338. The first inductor 342 may be electrically connected with the ground plane 312 by one or more vias 344 (best seen in FIG. 3B).

The signal path 316 of the filter 300 may include a second inductor 346, which may correspond with the second inductor 212 of the circuit diagram 200 of FIG. 2. The second inductor 346 may be formed on the third layer 308 (best seen in FIG. 3C). The second inductor 346 may be electrically connected at each of a first location 349 and a second location 351 with the signal path 316. In other words, the second inductor 346 may form a portion of the signal path 316 between the input 318 and the output 320.

One or more vias 348 may connect the second inductor 346 at the first location 349 with a portion 354 of the signal path 316 on the second layer 306 (best seen in FIGS. 3B, 4D, and 4E). One or more vias 348 may connect the first inductive element 346 at the second location 351 with each of a portion 369 of the signal path 316 on the top surface of the second layer 306 and with a conductive layer 352 on the bottom surface of the second layer 306 (which forms a second capacitor with the portion 354 of the signal path 316, described below). As best seen in FIGS. 3A and 4E, the inductor 346 may have four corners. As such, the first inductor 346 may form greater than half of a "loop."

The second capacitor may be formed between the conductive layer 352 and the portion 354 of the signal path 316. The second capacitor may correspond with the second capacitor 214 of the circuit diagram 200 of FIG. 2. The second capacitor may be a self-aligning capacitor.

The third inductor 356 of the filter 300 may correspond with the third inductor 216 of the circuit diagram 200 of FIG. 2. The third inductor 356 may be connected by one or more vias 360 at a first location 357 with the portion 369 of the signal path 316 that is connected with the second inductor 346. The third inductor 356 may be connected by one or more vias 360 at a second location 359 with the portion 361 of the signal path 316 that is connected with the output 320. The portion 361 of the signal path 316 may be electrically connected with the output 320 by one or more vias 366 and/or intermediary layers 368. In other words, the third inductor 356 may form a portion of the signal path 316 between the second inductor 346 and the output 320. The third inductor 356 may have a greater width at a protrusion 364 than along other portions of the third inductor 356.

A third capacitor may be formed in parallel with third inductor 356. The third capacitor may correspond with the third capacitor 214 of the circuit diagram 200 of FIG. 2. The third capacitor of the filter 300 may include a conductive layer 367 that is capacitively coupled with the portion 369 of the signal path 316.

A fourth inductor 370 may be electrically connected with the signal path 316 at a first location 371 and with the ground plane 312 at a second location 373 by vias 374. The vias 374 may be connected by intermediary layers 376. The fourth inductor 370 of the filter 300 may correspond with the fourth inductor 220 of the of the circuit diagram 200 of FIG. 2 The fourth inductor 370 of the filter 300 may be connected with the signal path 316 at the portion 361 of the signal path 316 that is electrically connected with the output 320. The fourth inductor 370 may have three corners 372 and form approximately one quarter of a loop.

A fourth capacitor may include a conductive layer 380 that is capacitively coupled with the portion 361 of the signal path 316 that is connected with the output 320. The conductive layer 380 of the fourth capacitor may be electrically connected with the ground plane 312 by vias 382. The fourth capacitor may correspond with the fourth capacitor 222 of the circuit diagram 200 of FIG. 2.

II. Example Inductors

Inductance is generally proportional to the length of an inductive element, but inversely proportional to a width of the inductive element. In other words, the inductance may be proportional to a length-to-average-width ratio of the inductive element. As such, small adjustments to the width and length of an inductive element can be used to fine tune inductance. This may be particularly useful for inductors designed to exhibit very low inductance, for example, for high frequency applications.

Figure 5A:
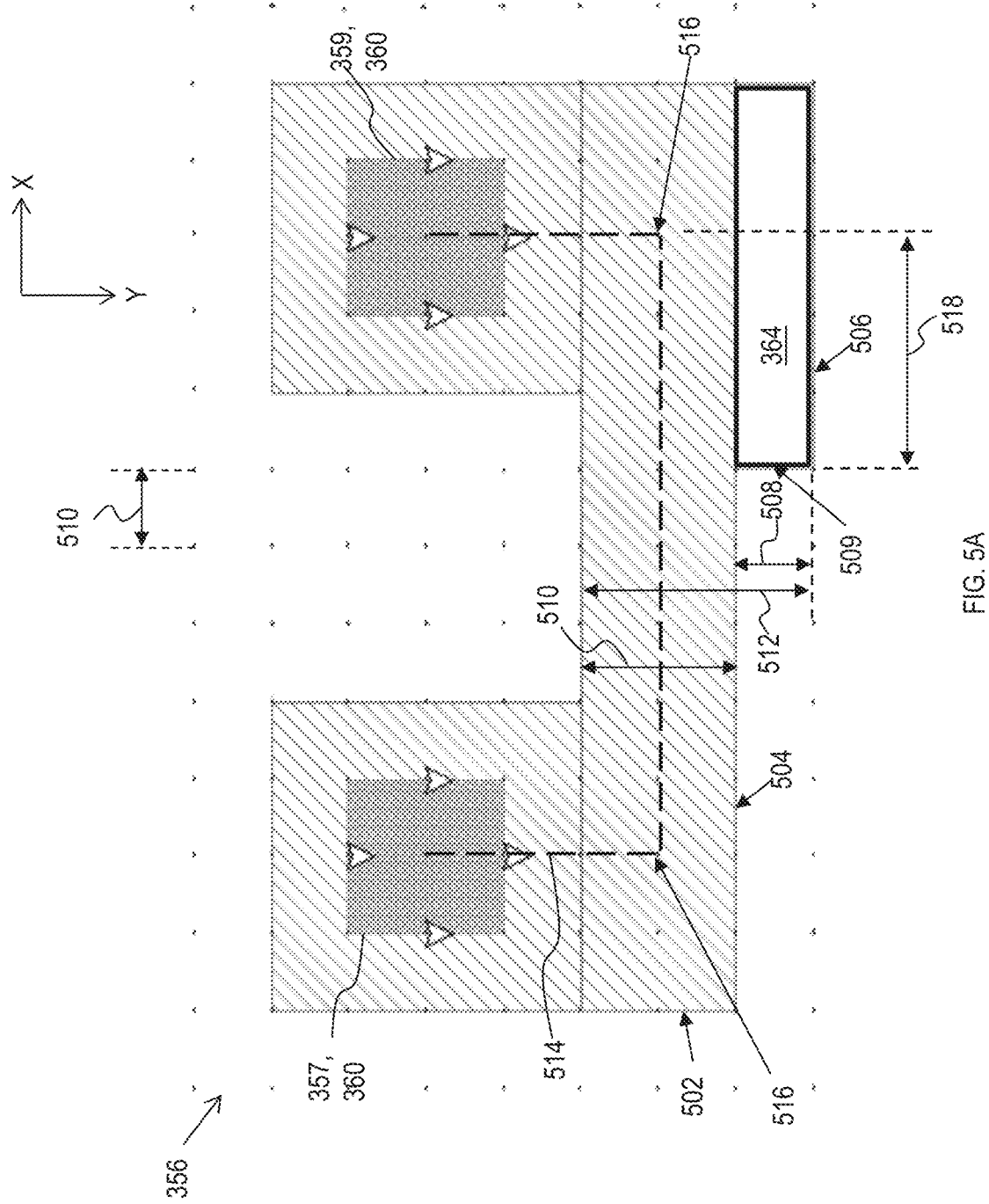
FIG. 5A is a top down view of the third inductor of the filter described above with reference to FIGS. 3A through 4E.

FIG. 5A is a top down view of the third inductor 356 of the filter 300, described above with reference to FIGS. 3A through 4E. As indicated above, the inductor 356 may be connected with vias 360 at the first location 357 and the second location 359.

The inductor 356 may have an outer perimeter 502. The outer perimeter 502 may define the boundary of the conductive layer that forms the inductor 356.

The outer perimeter 502 may include a first straight edge 504 that faces outward in a first direction (e.g., the positive Y-direction). The outer perimeter 502 may include a second straight edge 506 that is parallel to the first straight edge 504 and faces outward in the first direction (e.g., the positive Y-direction). The second straight edge 506 may be offset from the first straight edge 504 by an offset distance 508. The offset distance 508 may be less than about 500 microns. In some embodiments, offset distance 508 may be less than about 90% of a first width 510 of the inductor at the first straight edge 504. In some embodiments, the offset distance 508 may be approximately equal to a single minimum line width 510 (e.g., about 50 microns). The minimum line width 510 (represented by grid points in FIG. 5A) may be defined as the smallest feature size that can be accurately patterned.

The outer perimeter 502 may include a width discontinuity edge 509 extending between the first straight edge 504 and the second straight edge 506. The width discontinuity edge 509 may be perpendicular to the first straight edge 504 and second straight edge 506.

The inductor 356 may have the first width 510 at the first straight edge 504 (e.g., proximate the width discontinuity edge 509). The first width 510 may be defined in a local width direction (e.g., the Y-direction) that is perpendicular to the first straight edge 504. The inductor 356 may have a second width 512 at the second straight edge 506 (e.g., proximate the width discontinuity edge 509). The second width 512 may be defined in the local width direction (e.g., the Y-direction). The second width 512 may be greater than the first width 510. The offset distance 508 may be equal to the second width 512 minus the first width 510.

As described above with reference to FIGS. 3A through 4E, the inductor 356 may be connected with vias at the first location 537 and the second location 538. A longitudinal centerline 514 may extend along the inductor 356 between the first location 537 and the second location 538. The longitudinal centerline 514 may have a length equal to an effective length of the inductor 356. The longitudinal centerline 514 may include one or more corners 516. The width discontinuity edge 509 may be spaced apart from a corner 516 of the longitudinal centerline 514 of the inductor 356 by a distance 518. The distance 518 may be at least 30 microns. In this example, the distance 518 corresponds with an effective length of a tab or protrusion 364 which acts to the increase the width of the inductor 356.

The inductor 356 may have a variety of widths defined in respective local width directions that are perpendicular to the longitudinal centerline 514 of the inductor 356. The inductor 356 may have an average width that is an average of the widths of the inductor 356 respectively weighted by lengths associated with each along the longitudinal centerline 514. A length-to-average-width ratio of the inductor 356 may be defined as the effective length of the inductor 356 divided by the average width of the inductor 356.

Adjusting the dimensions (e.g., offset distance 508, effective length 518) of the one or more of the protrusions 364 can be used to finely tune the average width and length-to-average-width ratio of the inductor 356, and thereby finely tune the inductance of the inductor 356. Example average widths and length-to-average-width-ratios are provided in the "Examples" section.

Figure 5B:
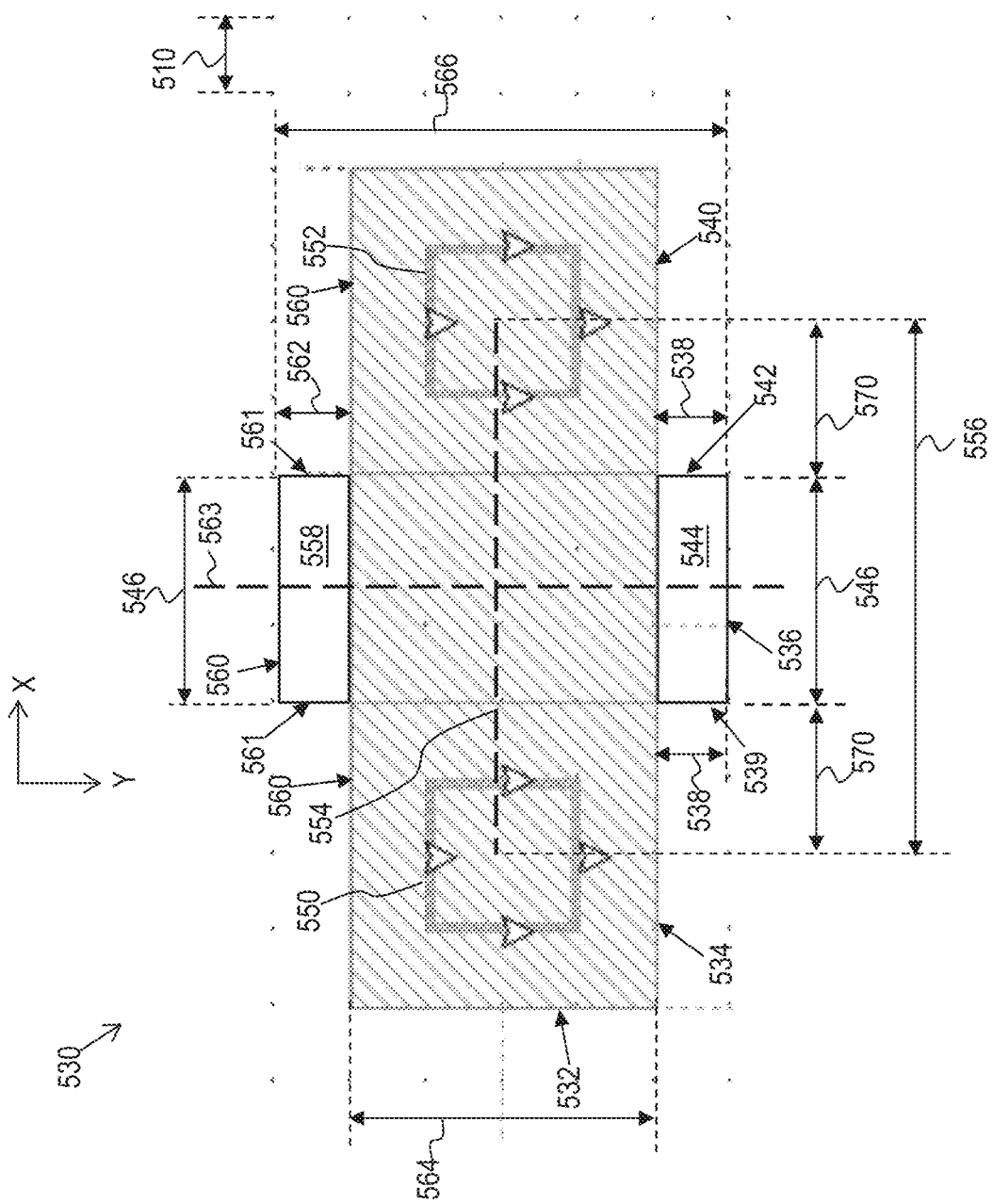
FIG. 5B is a top down view of an embodiment of an inductor including a pair of protrusions according to aspects of the present disclosure.

Referring to FIG. 5B, an inductor 530 may be similar to a third inductor 820 of a filter 800 described below with reference to FIGS. 8A through 9E, except that the inductor 530 illustrated in FIG. 5B includes offset edges according to aspects of the present disclosure.

The inductor 530 may have an outer perimeter 532. The outer perimeter 532 may define the boundary of the conductive layer that forms the inductor 530. The outer perimeter 502 may include a first straight edge 534 that faces outward in a first direction (e.g., the positive Y-direction). The outer perimeter 532 may include a second straight edge 536 that is parallel to the first straight edge 534 and faces outward in the first direction (e.g., the positive Y-direction). The second straight edge 536 may be offset from the first straight edge 534 by an offset distance 538. The offset distance 538 may be less than about 500 microns. In some embodiments, the offset distance 538 may be approximately equal to a single minimum line width 510 (e.g., about 50 microns).

The outer perimeter 532 may include a width discontinuity edge 539 extending between the first straight edge 534 and the second straight edge 536 (e.g., in the Y-direction). The width discontinuity edge 539 may be perpendicular to the first straight edge 534 and second straight edge 536.

The inductor 530 may have a third straight edge 540 and a second discontinuity edge 542 extending between the second straight edge 536 and the third straight edge 540. The third straight edge 540 may be parallel and aligned with the first straight edge 534 such that a tab or protrusion 544 is formed. The protrusion 544 may have a length 546 in a direction parallel with the second straight edge 536.

The inductor 530 may be connected with vias at a first location 550 and a second location 552. A longitudinal centerline 554 may extend along the inductor 530 between the first location 550 and the second location 552. The longitudinal centerline 554 may have a length 556 equal to an effective length of the inductor 530.

The inductor 530 may include an additional protrusion 558. The additional protrusion 558 may be defined with respect to straight edges 560 and width discontinuity edges 561 of the outer perimeter 532 of the inductor 530 in the same manner as the protrusion 544. An offset distance 562 associated with the additional protrusion 558 may be defined between the straight edged 560 in the same manner as the protrusion 544.

The additional protrusion 558 (including associated width discontinuity edges 561) may be symmetric about the longitudinal centerline 554 and/or a lateral centerline 563 with the protrusion 554 (including associated with discontinuity edges 539, 542). The entire inductor 540 may be symmetric about the longitudinal centerline 554 and/or the lateral centerline 563.

The inductor 530 may have a first width 564 at the first straight edge 534. The first width 564 may be defined in a local width direction (e.g., the Y-direction) that is perpendicular to the first straight edge 534. The inductor 530 may have a second width 566 at the second straight edge 536 (e.g., proximate the width discontinuity edge 539). The second width 566 may be defined in the local width direction (e.g., the Y-direction). The second width 566 may be greater than the first width 564. In this example, a difference between the second width 566 and the first width 564 may be equal to the sum of the offset distances 542, 561.

The inductor 530 may have first lengths 570 along the longitudinal centerline 554 associated with the first width 564. The inductor 530 may have a length along the second width 566 that is equal to the length of the 546 of the protrusions 554, 558. The inductor 530 may have an average width that is a weighted average of the widths 564, 566 of the inductor 530 according to the lengths 546, 570 associated with the widths 564, 566. A length-to-average-width ratio of the inductor 530 may be defined as the effective length 556 of the inductor 530 divided by the average width of the inductor 530.

Adjusting the dimensions and/or locations of one or more of the protrusions 558 can be used to finely tune the average width and length-to-average-width ratio of the inductor 530, and thereby finely tune the inductance of the inductor 530. Example average widths and length-to-average-width-ratios are provided in the "Examples" section.

FIG. 5C is a top down view of an inductor 572 according to aspects of the present disclosure. The inductor 572 may be similar to a third inductor 1020 of a filter 1000 described below with reference to FIGS. 10A through 11D, except that the inductor 572 may include a first straight edge 576 and a second straight edge 577 that is offset from the first straight edge 576 by an offset distance 575 in the manner described above with reference to FIGS. 5A and 5B. The first straight edge 576 may be perpendicular to second straight edge 577. A width discontinuity edge 578 may be connected between the straight edges 576, 577. The width discontinuity edge 578 may be perpendicular to the straight edges 576, 577. The offset distance 575 may be defined in a direction perpendicular to the straight edges 576, 577. The inductor 572 may include a protrusion 574 associated with the with the width discontinuity edge 578.

The inductor 572 may be connected with vias at a first location 581 and a second location 583. A longitudinal centerline 571 may be defined between the first location and second location 581, 583. An effective length 579 of the inductor 572 may be defined along the longitudinal centerline 571 between the first location and second location 581, 583. The inductor 572 may have a first width 580 and a second width 582 that may be defined relative to the edges 576, 577 in the same manner as described above with reference to FIGS. 5A and 5B. The inductor 572 may have first and second lengths 584, 585 that are respectively associated with the first and second widths 580, 582.

The inductor 572 may have an average width that is a weighted average of the widths 580, 582 of the inductor 572 according to the respective associated lengths 584, 585 along the longitudinal centerline 571. A length-to-average-width ratio of the inductor 572 may be defined as the effective length 579 of the inductor 572 divided by the average width of the inductor 572. Adjusting the dimensions and/or locations the protrusion 574 can be used to finely tune the average width and length-to-average-width ratio of the inductor 572, and thereby finely tune the inductance of the inductor 572. Example average widths and length-to-average-width-ratios are provided in the "Examples" section.

Figure 5D:
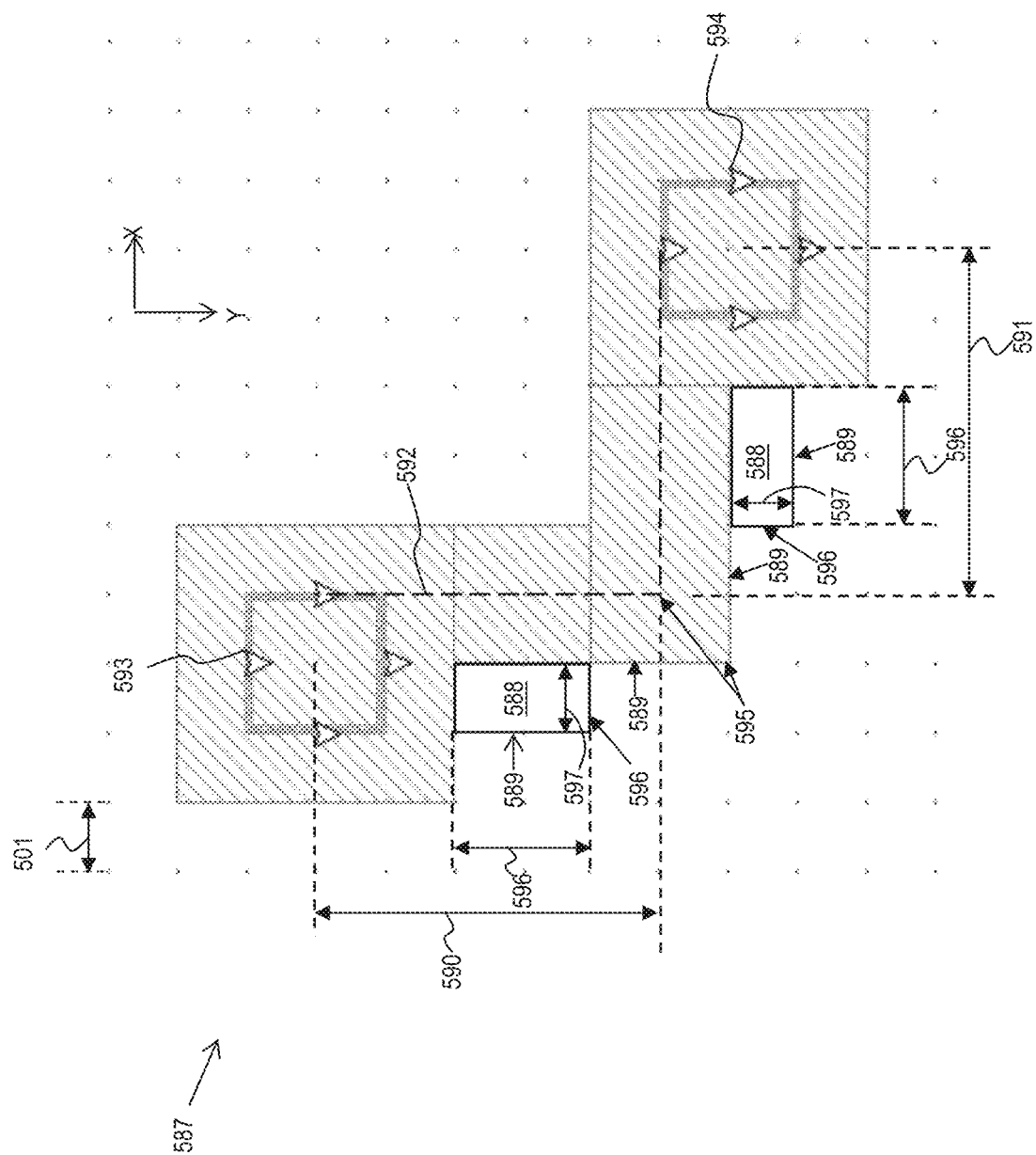
FIG. 5D is a top down view of another embodiment of an inductor including a pair of protrusions according to aspects of the present disclosure.

Referring to FIG. 5D, an inductor 587 may include two protrusions 588 defined relative to various respective straight edges 589, lengths 596, offset distances 597, and discontinuity edges 596 in the manner described with reference to FIGS. 5A and 5B. The inductor 587 may be similar to a fourth inductor 1024 of the filter 1000 described below with reference to FIGS. 10A through 11D, except that the inductor 587 includes the two protrusions 588.

The inductor 587 may have an effective length equal to a sum of a first length 590 and a second length 591 along a longitudinal centerline 592 between a first location 593 and a second location 594. The first and second lengths 590, 591 may be defined parallel with the longitudinal centerline 592. The inductor 587 and longitudinal centerline 592 may include a corner 595.

The inductor 587 may have various widths measured perpendicular to the straight edges 589. The various widths may be defined along the longitudinal centerline 592. The inductor 587 may have an average width that is calculated in a similar manner as described above with reference to FIG. 5A. Adjusting the dimensions and/or locations of one or more of the protrusions 586 can be used to finely tune average width and length-to-average-width ratio of the inductor 587, and thereby finely tune the inductance of the inductor 587. Example average widths and length-to-average-width-ratios are provided in the "Examples" section.

III. Additional Example Embodiments

Figure 6A:
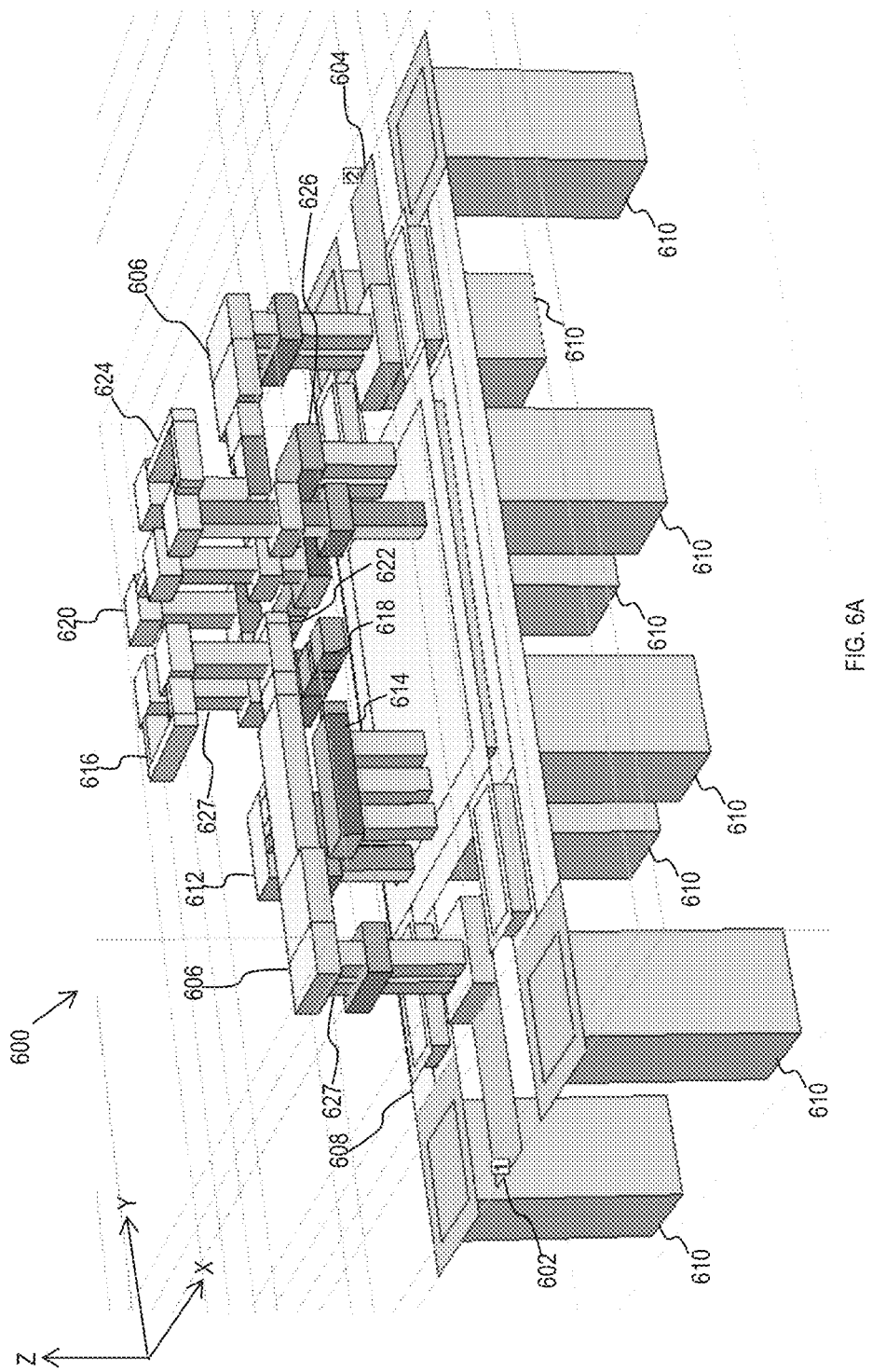
FIGS. 6A and 6B are perspective views of another embodiment of a multilayer filter according to aspects of the present disclosure.
Figure 6B:
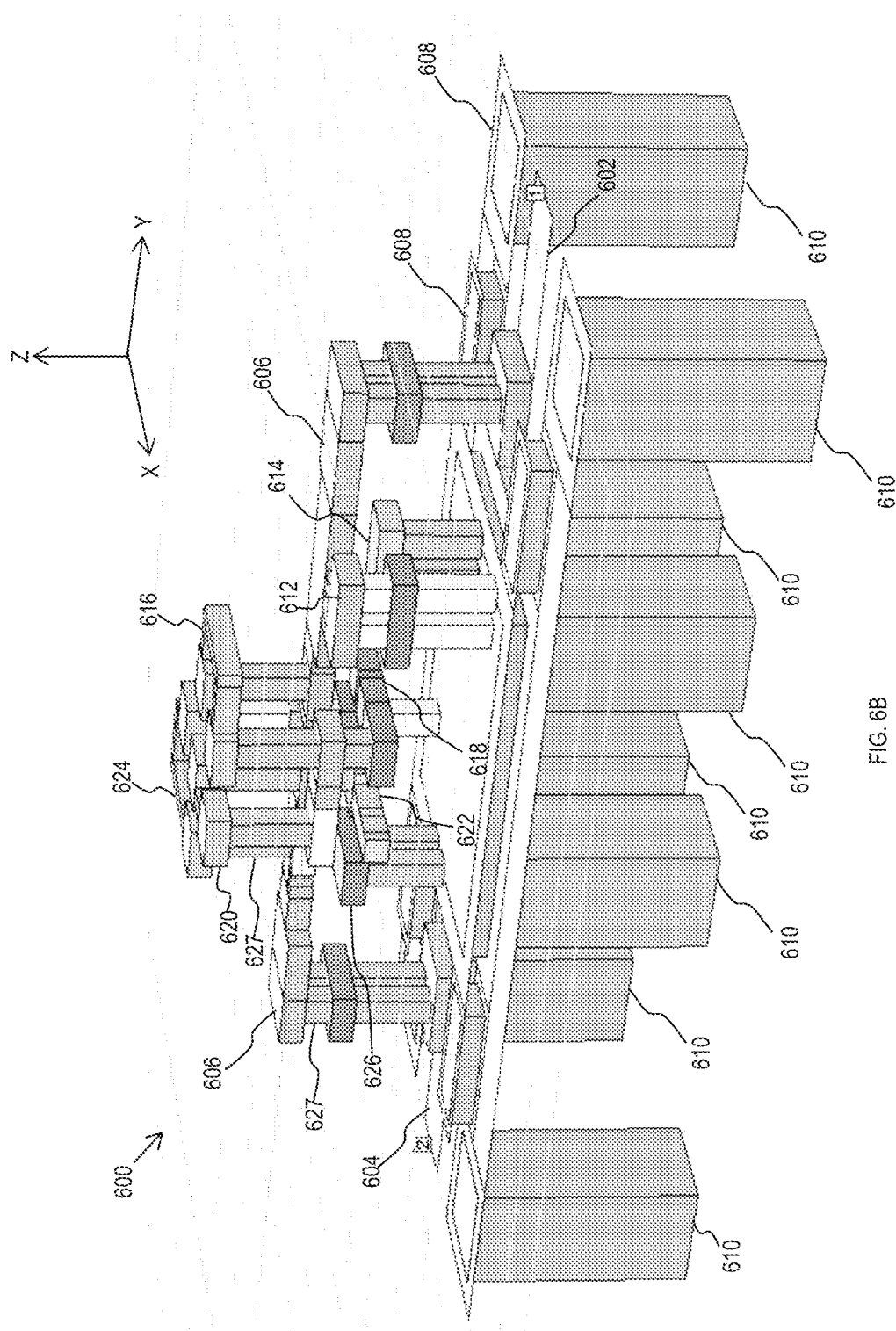

FIG. 6A illustrates a perspective view of another embodiment of a multilayer filter 600 according to aspects of the present disclosure. FIG. 6B illustrates another perspective view of the multilayer filter 600 of FIG. 6A. The filter 600 may generally be configured in a similar manner as the filter 300 described above with reference to FIGS. 3 through 5D. The filter 600 may include an input 602, an output 604, and a signal path 606 connecting the input 602 and the output 604. The filter 600 may also include a ground plane 608 electrically connected with one or more ground electrodes 610.

The filter 600 may include a first inductor 612 that is electrically connected with the ground plane 608. The first inductor 612 may correspond with the first inductor 208 of the circuit diagram 200 described above with reference to FIG. 2. The filter 600 may include a first capacitor 614 electrically coupled with the ground plane 608. The first capacitor 614 may correspond with the first capacitor 210 of the circuit diagram 200 described above with reference to FIG. 2.

The filter 600 may include a second inductor 616 and a second capacitor 618 that are connected in parallel with each other. The second inductor 616 and second capacitor 618 may correspond with the second inductor 212 and second capacitor 214, respectively, of the circuit diagram 200 described above with reference to FIG. 2. The second inductor 616 and second capacitor 618 may form a portion of the signal path 606 between the input 602 and the output 604. The filter 600 may include a third inductor 620 and third capacitor 622 that are connected in parallel with each other and may form a portion of the signal path 606 between the input 602 and the output 604. The third inductor 620 and third capacitor 622 may correspond with the third inductor 216 and third capacitor 218, respectively, of the circuit diagram 200 described above with reference to FIG. 2. Lastly, the filter 600 may include a fourth inductor 624 and fourth capacitor 626 that are connected in parallel with each other and connected between the signal path 606 and the ground plane 608. The fourth inductor 624 and fourth capacitor 626 may correspond with the fourth inductor 220 and the fourth capacitor 222, respectively, of the circuit diagram 200 described above with reference to FIG. 2.

The inductors 612, 616, 620, 624 and capacitors 614, 618, 622, 626 may be connected by vias 627 in a similar manner as described above with reference to FIGS. 3 through 5D. Each of the inductors 612, 616, 620, 624 may be connected with the signal path 606 at a respective first location and connected with the signal path 606 or the ground plane 608 at a respective second location. Each of the inductors 612, 616, 620, 624 may have a respective effective length (e.g., in the X-Y plane) between the first location and the second location. Additionally, each of the inductors 612, 616, 620, 624 may have a respective width along its respective effective length.

Figure 6C:
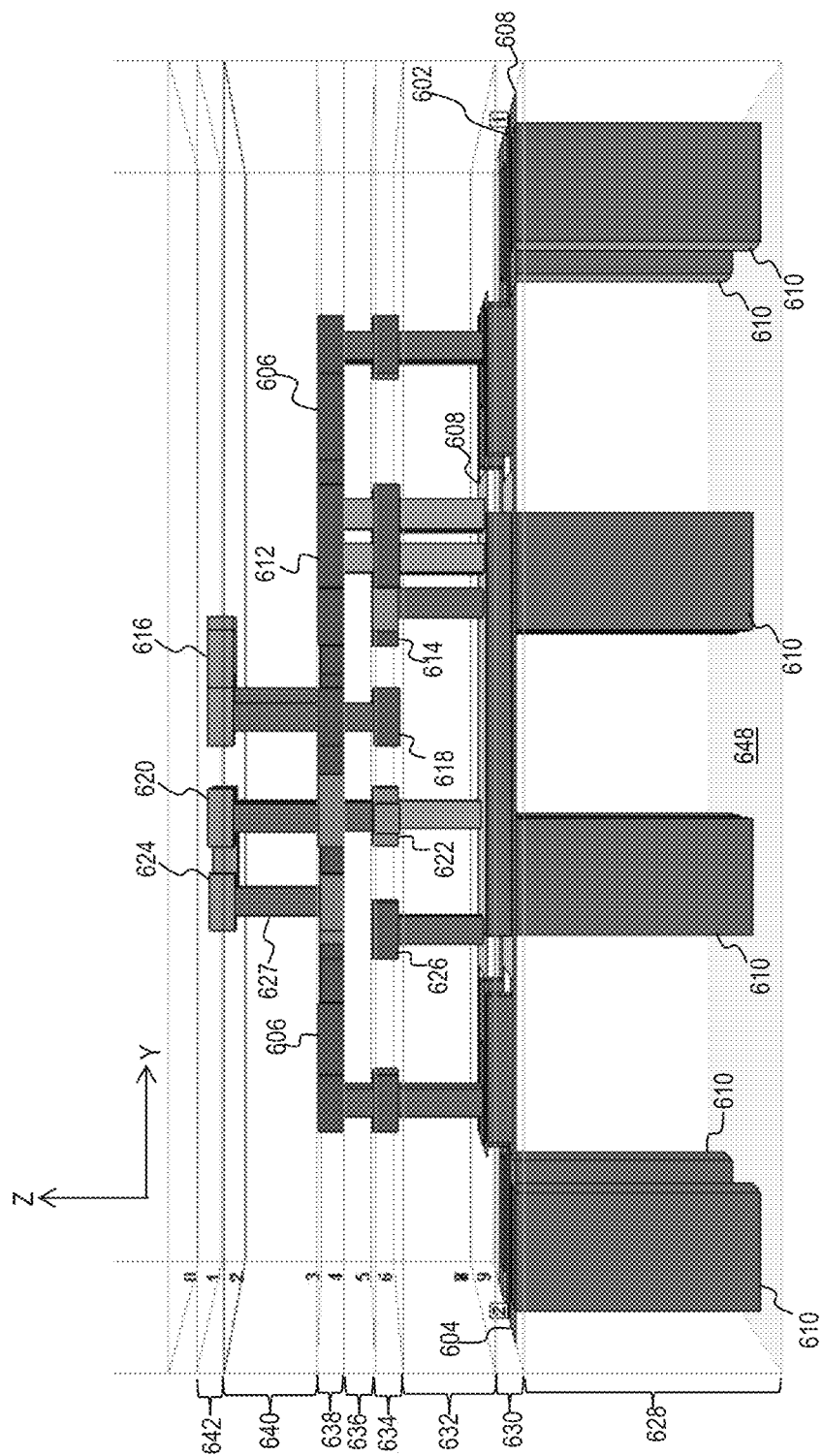
FIG. 6C is a side elevation view of the filter of FIGS. 6A and 6B.

FIG. 6C is a side elevation view of the filter 600 of FIGS. 6A and 6B. The band pass filter 600 may include a plurality of dielectric layers (transparent for clarity in FIGS. 6A and 6B). Referring to FIG. 6C, a first layer 632, a second layer 636, and a third layer 640 may be stacked to form a monolithic structure. Conductive layers 630, 634, 638, 642 may be formed on the dielectric layers 632, 636, 640. Conductive layer 630 may be formed on a bottom surface of the first dielectric layer 632. Conductive layers 634, 638 may be formed on a top surface and a bottom surface, respectively of the second dielectric layer 636. Conductive layer 642 may be formed on a top surface of the third dielectric layer 640.

Figure 7D:
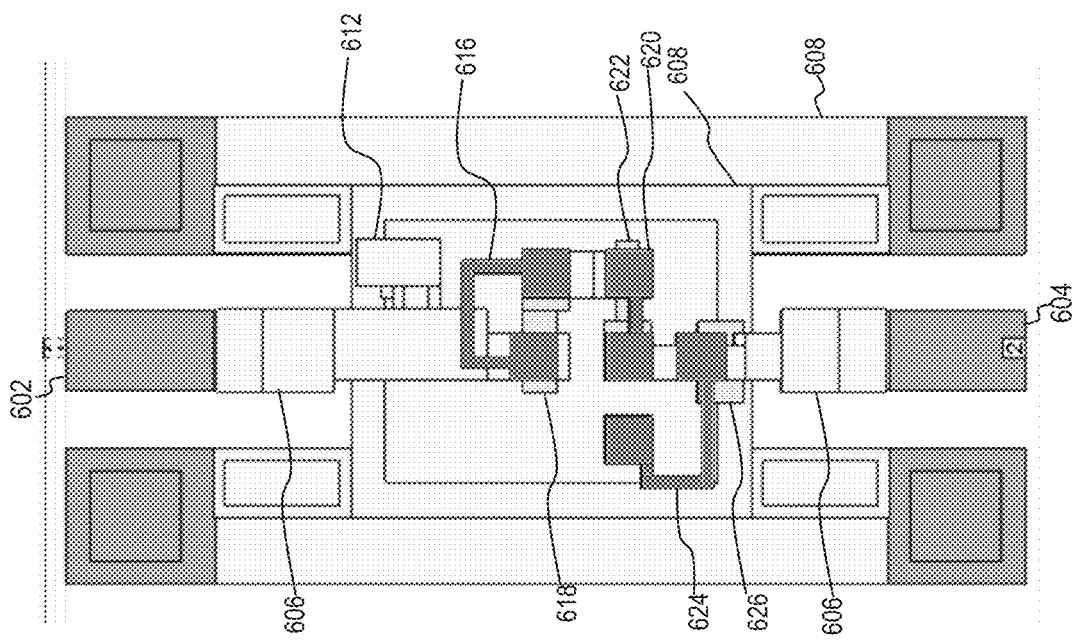
Figure 7C:
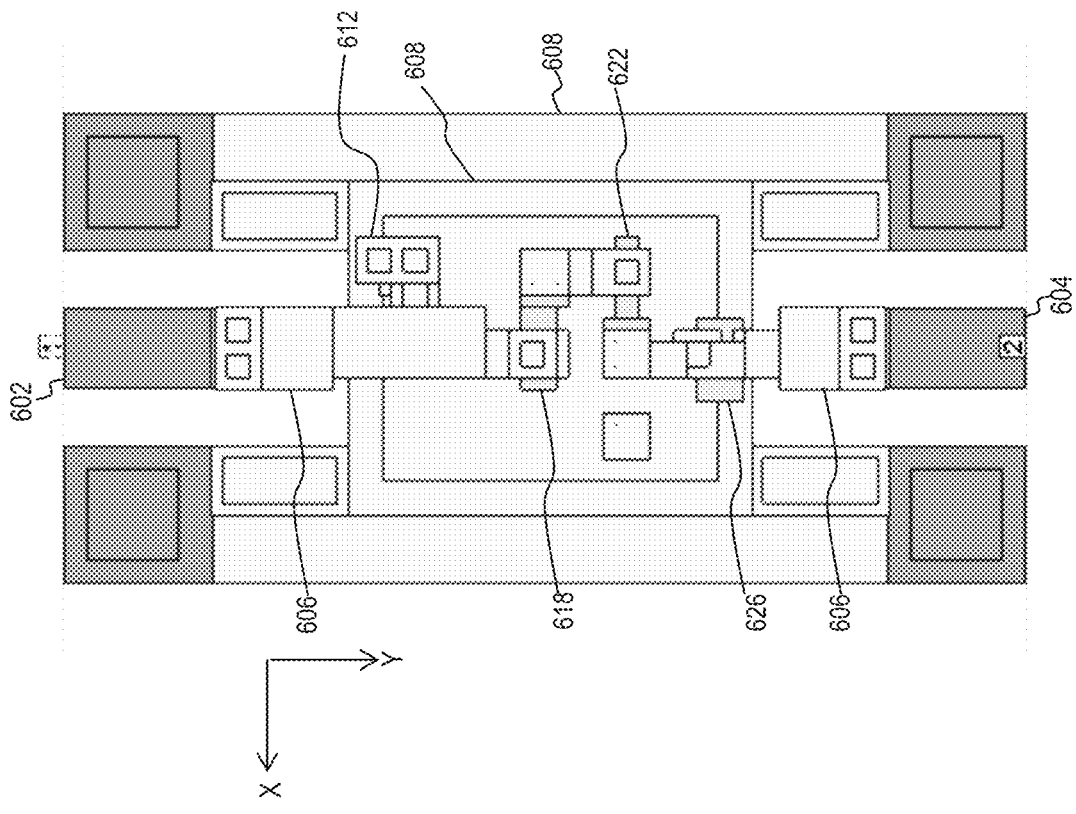

FIGS. 7A through 7D are a series of sequential top down views of the filter 600 of FIGS. 6A through 6C in which an additional dielectric layer is shown in each Figure. More specifically, FIG. 7A illustrates a mounting surface 628, such a printed circuit board. The first conductive layers 630 may include the ground plane 608, which may be formed on a bottom surface and a top surface of the first layer 632. FIG. 7B additionally illustrates the second conductive layer 634 formed on the first dielectric layer 632. The second conductive layer 634 may include the first capacitor 614, second capacitor 618, third capacitor 622 and forth capacitor 626. FIG. 7C additionally illustrates the third conductive layer 638 that is formed on the second dielectric layer 636. The third conductive layer 638 may include portions of the signal path 606 and the first inductor 612. FIG. 7D illustrates the fourth conductive layer 642 formed on the fourth dielectric layer 640. The fourth conductive layer 642 may include the second inductor 616, third inductor 622, and fourth inductor 624. The dielectric layers 632, 636, 640 are transparent to show the relative relocations of the various patterned conductive layers 630, 634, 638, 642.

Figure 8A:
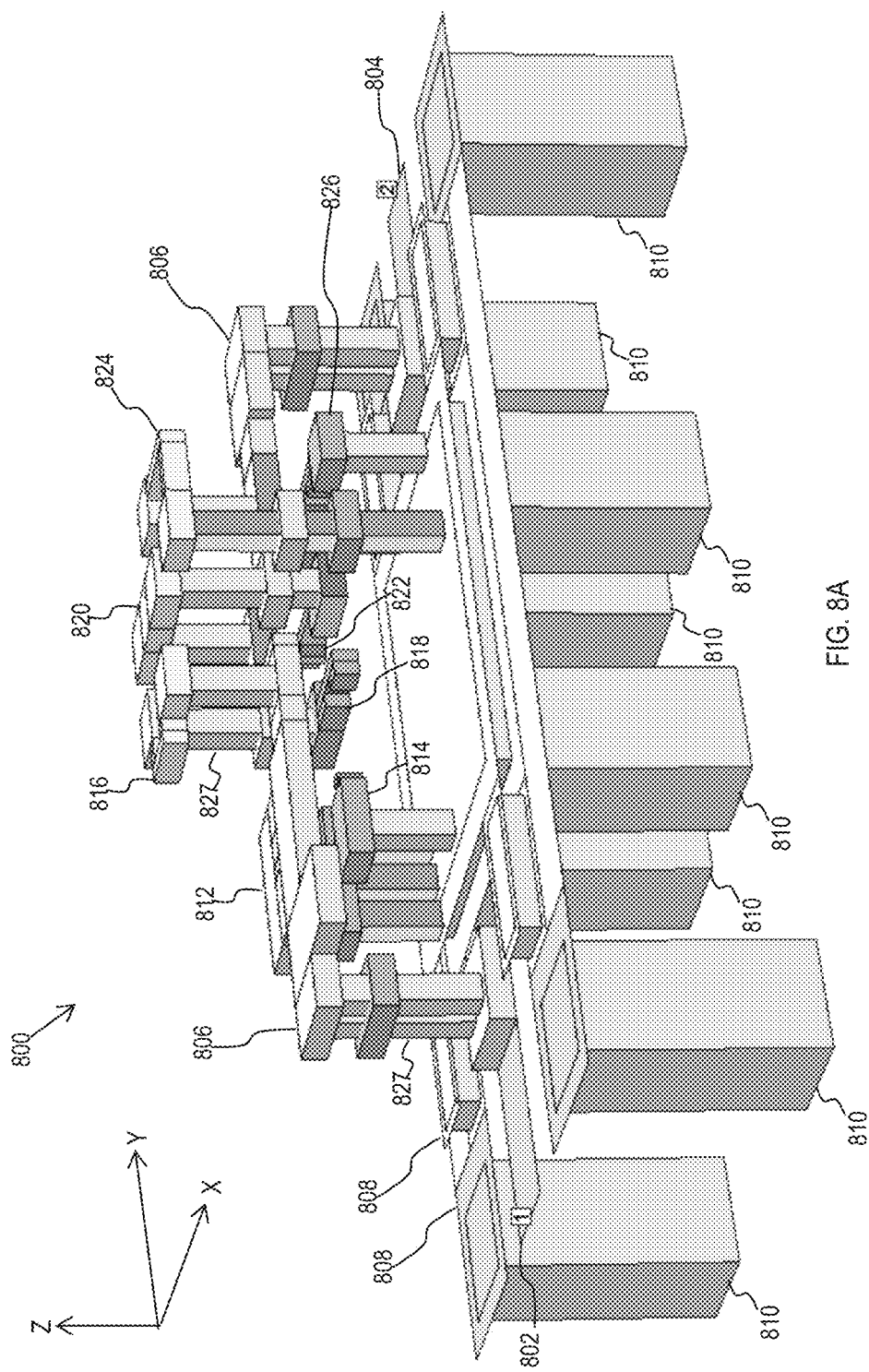
FIG. 8A is a perspective view of another embodiment of a multilayer filter according to aspects of the present disclosure.

FIG. 8A illustrates a perspective view of another embodiment of a multilayer filter 800 according to aspects of the present disclosure. The filter 800 may generally be configured in a similar manner as the filter 300 described above with reference to FIGS. 3 through 5D. The filter 800 may include an input 802, an output 804, and a signal path 806 connecting the input 802 and the output 804. The filter 800 may also include a ground plane 808 electrically connected with one or more ground electrodes 810.

The filter 800 may include a first inductor 812 that is electrically connected with the ground plane 808. The first inductor 812 may correspond with the first inductor 208 of the circuit diagram 200 described above with reference to FIG. 2. The filter 800 may include a first capacitor 814 electrically coupled with the ground plane 808. The first capacitor 814 may correspond with the first inductor capacitor 210 of the circuit diagram 200 described above with reference to FIG. 2. The filter 800 may include a second inductor 816 and second capacitor 818 that are connected in parallel with each other. The second inductor 816 and second capacitor 818 may correspond with the second inductor 212 and second capacitor 214, respectively, of the circuit diagram 200 described above with reference to FIG. 2. The second inductor 816 and second capacitor 818 may form a portion of the signal path 806 between the input 802 and the output 804. The filter 800 may include a third inductor 820 and third capacitor 822 that are connected in parallel with each other and may form a portion of the signal path 806 between the input 802 and the output 804. The third inductor 820 and third capacitor 822 may correspond with the third inductor 216 and third capacitor 218, respectively, of the circuit diagram 200 described above with reference to FIG. 2. Lastly, the filter 800 may include a fourth inductor 824 and fourth capacitor 826 that are connected in parallel with each other and connected between the signal path 806 and the ground plane 808. The fourth inductor 824 and fourth capacitor 826 may correspond with the fourth inductor 220 and the fourth capacitor 222, respectively, of the circuit diagram 200 described above with reference to FIG. 2.

The inductors 812, 816, 820, 824 and capacitors 814, 818, 822, 826 may be connected by vias 827 in a similar manner as described above with reference to FIGS. 3 through 5D. Each of the inductors 812, 818, 820, 824 may be connected with the signal path 806 at a respective first location and connected with the signal path 806 or the ground plane 808 at a respective second location. Each of the inductors 812, 818, 820, 824 may have a respective effective length (e.g., in the X-Y plane) between the first location and the second location. Additionally, each of the inductors 812, 818, 820, 824 may have a respective width along its respective effective length.

Figure 8B:
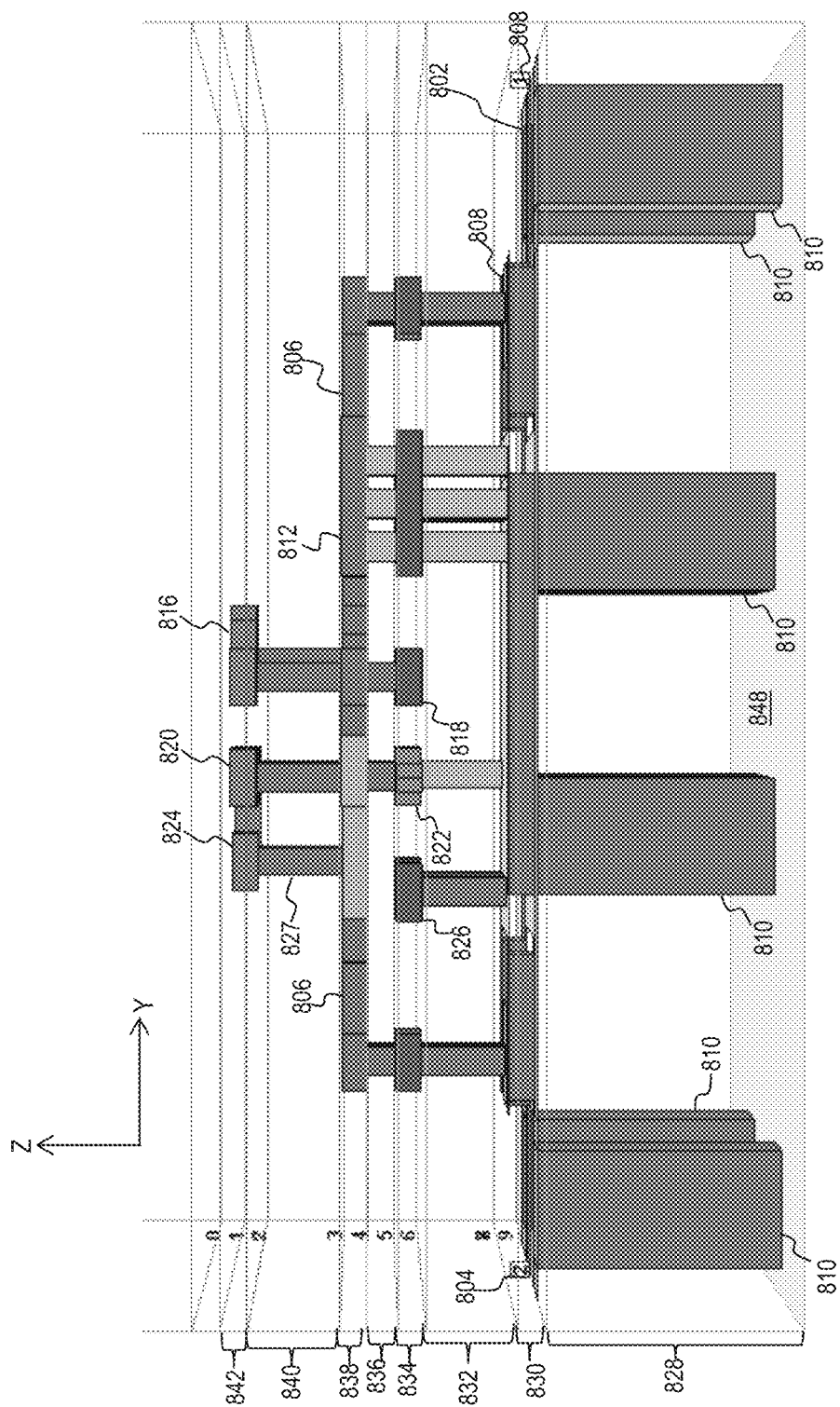
FIG. 8B is a side elevation view of the filter of FIG. 8A.

FIG. 8B is a side elevation view of the filter 800 of FIG. 8A. The band pass filter 800 may include a plurality of dielectric layers (transparent for clarity in FIG. 8A). Referring to FIG. 8B, a first layer 832, a second layer 836, and a third layer 840 may be stacked to form a monolithic structure. Conductive layers 830, 834, 838, 842 may be formed on the dielectric layers 832, 836, 840. Conductive layer 830 may be formed on a bottom surface of the first dielectric layer 832. Conductive layers 834, 838 may be formed on a top surface and a bottom surface, respectively of the second dielectric layer 836. Conductive layer 842 may be formed on a top surface of the third dielectric layer 840.

FIGS. 9A through 9D are a series of sequential top down views of the filter 600 of FIGS. 8A and 8B in which an additional dielectric layer is shown in each Figure. More specifically, FIG. 9A illustrates a mounting surface 828, such as a printed circuit board. The first conductive layers 830 may include the ground plane 808, which may be formed on a bottom surface and a top surface of the first layer 832. FIG. 9B additionally illustrates the second conductive layer 834 formed on the first dielectric layer 832. The second conductive layer 834 may include the first capacitor 814, second capacitor 818, third capacitor 822 and forth capacitor 826. FIG. 9C additionally illustrates the third conductive layer 838 that is formed on the second dielectric layer 836. The third conductive layer 838 may include portions of the signal path 806 and the first inductor 812. FIG. 9D illustrates the fourth conductive layer 842 formed on the fourth dielectric layer 840. The fourth conductive layer 842 may include the second inductor 816, third inductor 822, and fourth inductor 824. The dielectric layers 832, 836, 840 are transparent to show the relative relocations of the various patterned conductive layers 830, 834, 838, 842.

Figure 10A:
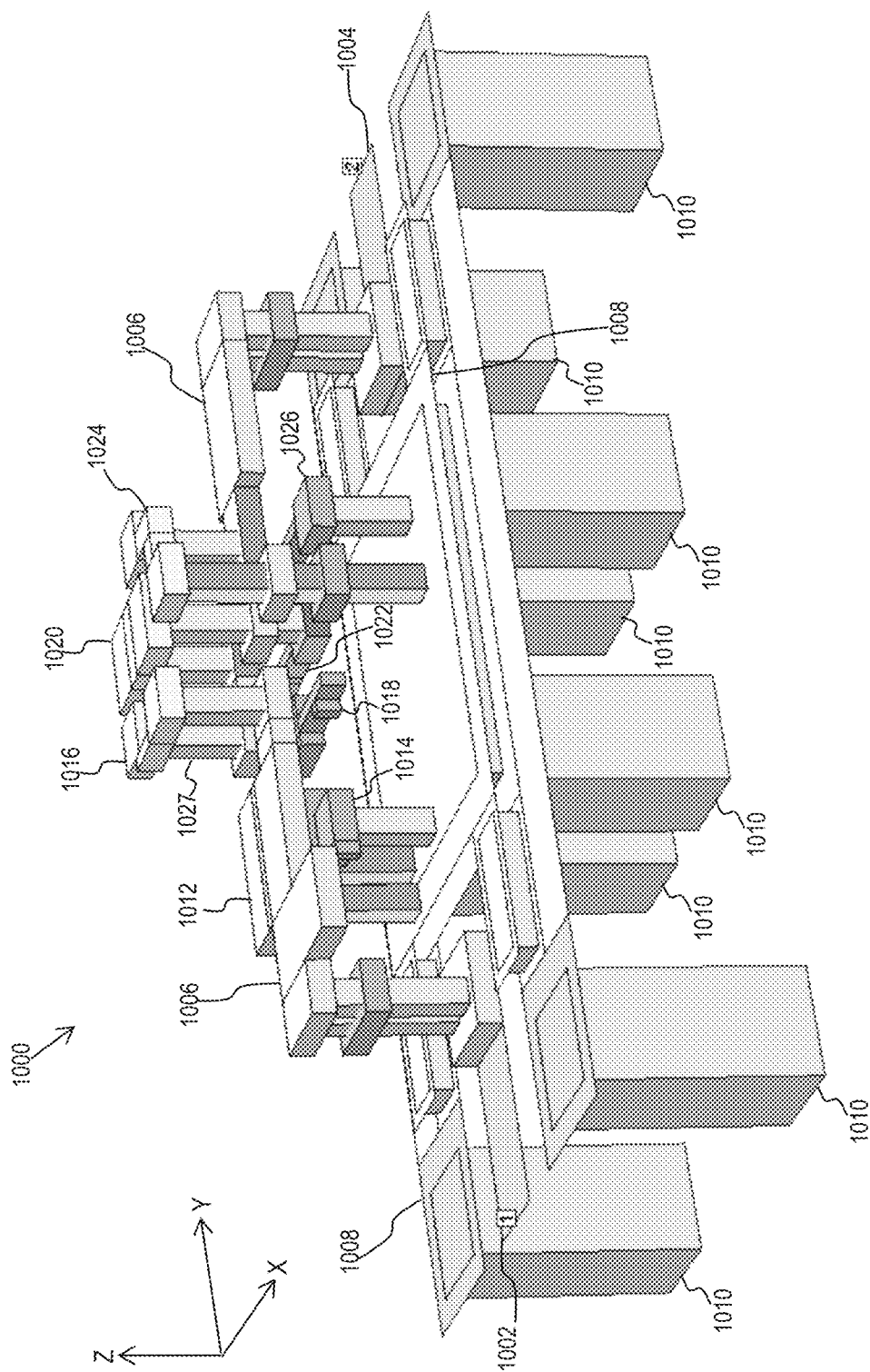
FIG. 10A is a perspective view of another embodiment of a multilayer filter according to aspects of the present disclosure.
Figure 10B:
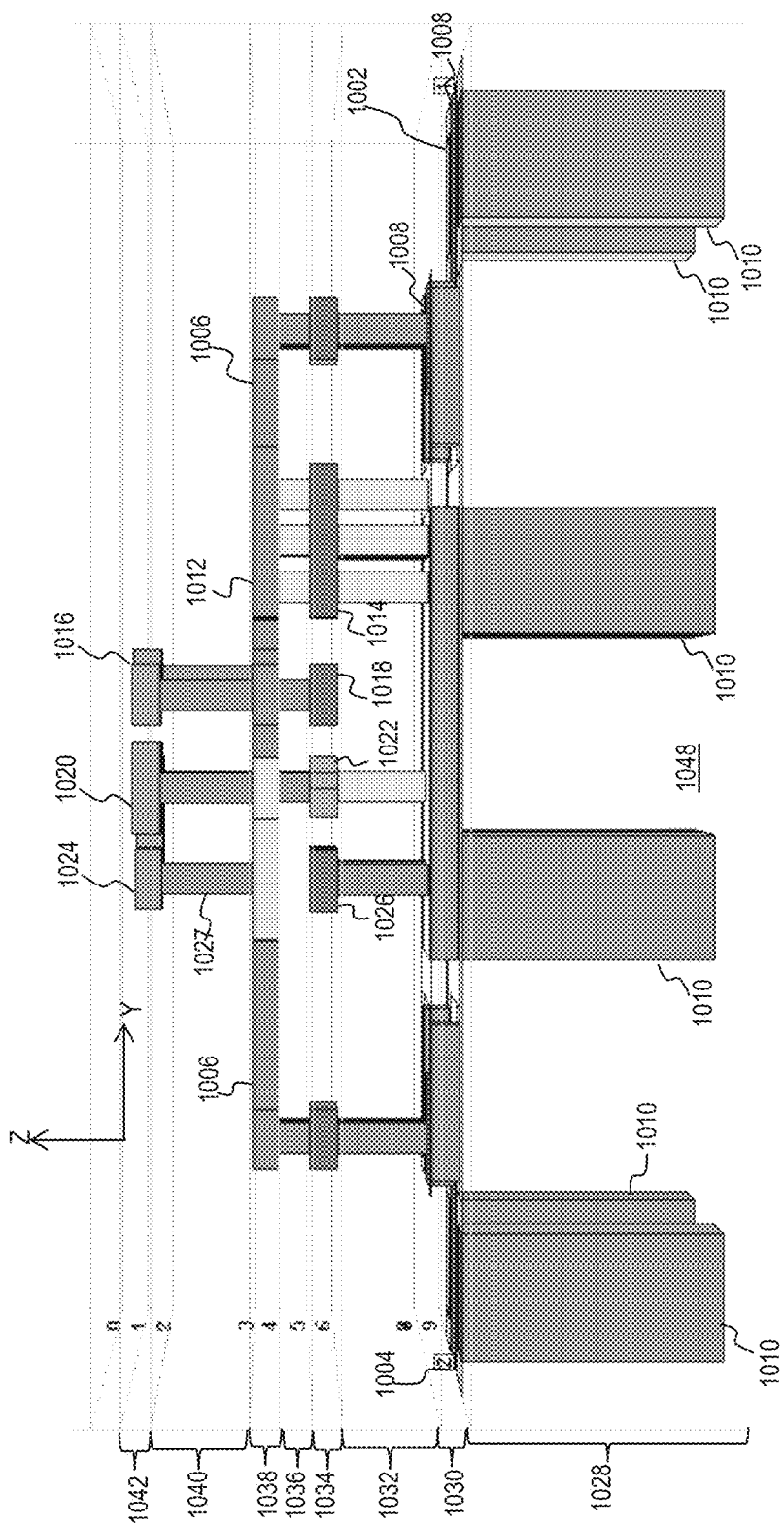
FIG. 10B is a side elevation view of the filter of FIG. 10A.

FIG. 10A illustrates a perspective view of another embodiment of a multilayer filter 1000 according to aspects of the present disclosure. FIG. 10B illustrates another perspective view of the multilayer filter 1000 of FIG. 10A. The filter 1000 may generally be configured in a similar manner as the filter 300 described above with reference to FIGS. 3 through 5D. The filter 1000 may include an input 1002, an output 1004, and a signal path 1006 connecting the input 1002 and the output 1004. The filter 1000 may also include a ground plane 1008 electrically connected with one or more ground electrodes 1010.

The filter 1000 may include a first inductor 1012 that is electrically connected with the ground plane 1008. The first inductor 1012 may correspond with the first inductor 208 of the circuit diagram 200 described above with reference to FIG. 2. The filter 1000 may include a first capacitor 1014 electrically coupled with the ground plane 1008. The first capacitor 1014 may correspond with the first inductor capacitor 210 of the circuit diagram 200 described above with reference to FIG. 2. The filter 1000 may include a second inductor 1016 and second capacitor 1018 that are connected in parallel with each other. The second inductor 1016 and second capacitor 1018 may correspond with the second inductor 212 and second capacitor 214, respectively, of the circuit diagram 200 described above with reference to FIG. 2. The second inductor 1016 and second capacitor 1018 may form a portion of the signal path 1006 between the input 1002 and the output 1004. The filter 1000 may include a third inductor 1020 and third capacitor 1022 that are connected in parallel with each other and may form a portion of the signal path 1006 between the input 1002 and the output 1004. The third inductor 1020 and third capacitor 1022 may correspond with the third inductor 216 and third capacitor 218, respectively, of the circuit diagram 200 described above with reference to FIG. 2. Lastly, the filter 1000 may include a fourth inductor 1024 and fourth capacitor 1026 that are connected in parallel with each other and connected between the signal path 1006 and the ground plane 1008. The fourth inductor 1024 and fourth capacitor 1026 may correspond with the fourth inductor 220 and the fourth capacitor 222, respectively, of the circuit diagram 200 described above with reference to FIG. 2.

The inductors 1012, 1016, 1020, 1024 and capacitors 1014, 1018, 1022, 1026 may be connected by vias 1027 in a similar manner as described above with reference to FIGS. 3 through 5D. Each of the inductors 1012, 10110, 1020, 1024 may be connected with the signal path 1006 at a respective first location and connected with the signal path 1006 or the ground plane 1008 at a respective second location. Each of the inductors 1012, 10110, 1020, 1024 may have a respective effective length (e.g., in the X-Y plane) between the first location and the second location. Additionally, each of the inductors 1012, 10110, 1020, 1024 may have a respective width along its respective effective length.

FIG. 10B is a side elevation view of the filter 1000 of FIGS. 10A and 10B. The band pass filter 1000 may include a plurality of dielectric layers (transparent for clarity in FIG. 10A). Referring to FIG. 10B, a first layer 1032, a second layer 1036, a third layer 1040 may be stacked to form a monolithic structure. Conductive layers 1030, 1034, 1038, 1042 may be formed on the dielectric layers 1032, 1036, 1040. Conductive layer 1030 may be formed on a bottom surface of the first dielectric layer 1032. Conductive layers 1034, 1038 may be formed on a top surface and a bottom surface, respectively of the second dielectric layer 1036. Conductive layer 1042 may be formed on a top surface of the third dielectric layer 1040.

FIGS. 11A through 11D are a series of sequential top down views of the filter 600 of FIGS. 10A and 10B in which an additional dielectric layer is shown in each Figure. More specifically, FIG. 11A illustrates a mounting surface 1028, such a printed circuit board. The first conductive layer 1030 may include the ground plane 1008, which may be formed on a bottom surface and a top surface of the first layer 1030. FIG. 11B additionally illustrates the second conductive layer 1034 formed on the first dielectric layer 1032. The second conductive layer 1034 may include the first capacitor 1014, second capacitor 1018, third capacitor 1022 and forth capacitor 1026. FIG. 11C additionally illustrates the third conductive layer 1038 that is formed on the second dielectric layer 1036. The third conductive layer 1038 may include portions of the signal path 1006 and the first inductor 1012. FIG. 11D illustrates the fourth conductive layer 1042 formed on the fourth dielectric layer 1040. The fourth conductive layer 1042 may include the second inductor 1016, third inductor 1022, and fourth inductor 1024. The dielectric layers 1032, 1036, 1040 are transparent to show the relative relocations of the various patterned conductive layers 1030, 1034, 1038, 1042.

IV. Applications

The various embodiments of the filter described herein may find application in any suitable type of electrical component. The filter may find particular application in devices that receive, transmit, or otherwise employ high frequency radio signals. Example applications include smartphones, signal repeaters (e.g., small cells), relay stations, and radar.

V. Testing and Simulation Data

Computer modeling was used to simulate multilayer filters according to aspects of the present disclosure. Additionally, filters were built and tested.

The thicknesses of the dielectric layers may generally be less than about 180 micrometers ("microns"). For instance, in some embodiments, the first layers 304, 632, 832, 1032 may be about 60 microns thick. The second layers 306, 636, 836, 1036 may be about 20 microns thick. The third layers 308, 640, 840, 1040 may be about 60 microns thick.

In some embodiments, the overall length of the filters may be 4.3 mm. The overall width may be about 4 mm. The overall thickness may be about 230 microns.

Figure 12:
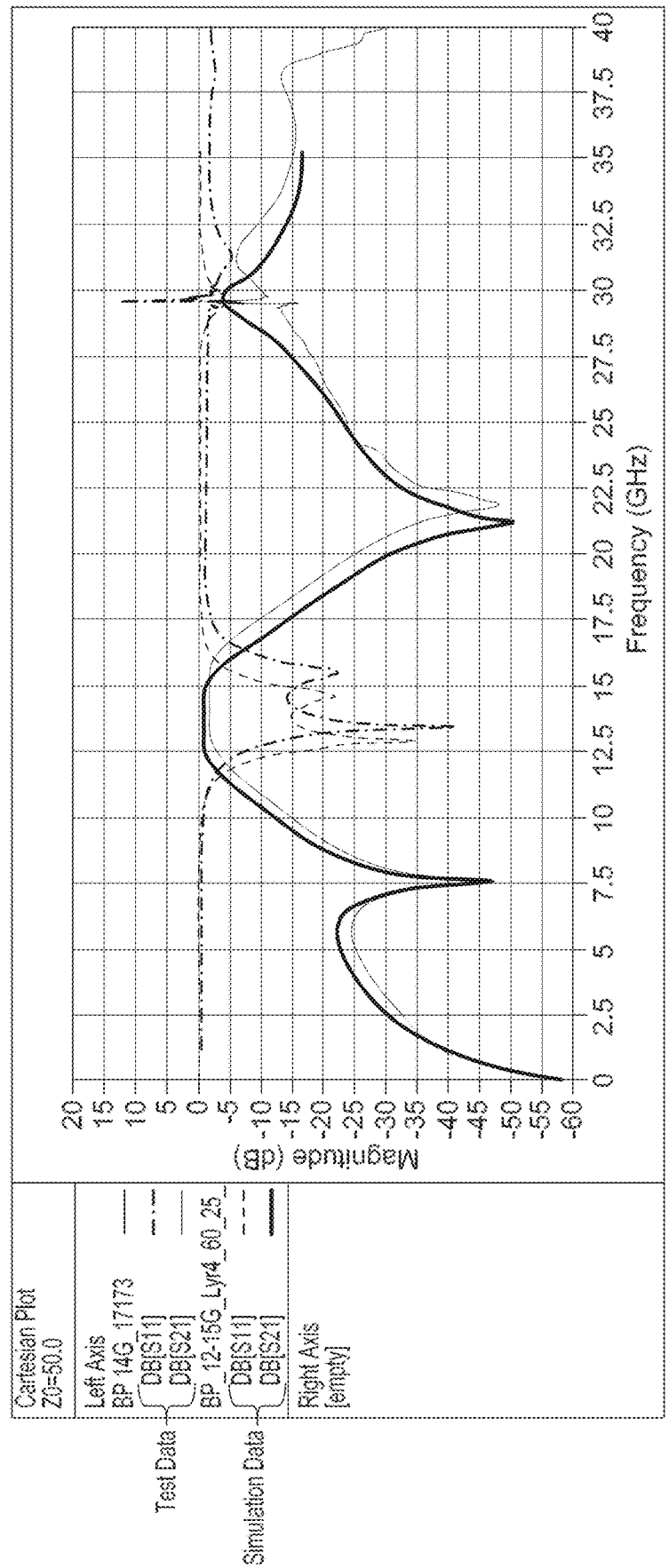
FIG. 12 is a plot of test data including measured insertion loss and return loss values for a filter constructed according to aspects of the present disclosure.

FIGS. 12-17 present test results and simulation data for the various filters. Referring to FIG. 12, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The measured pass band is from about 13.2 GHz to about 15.8 GHz.

Figure 13:
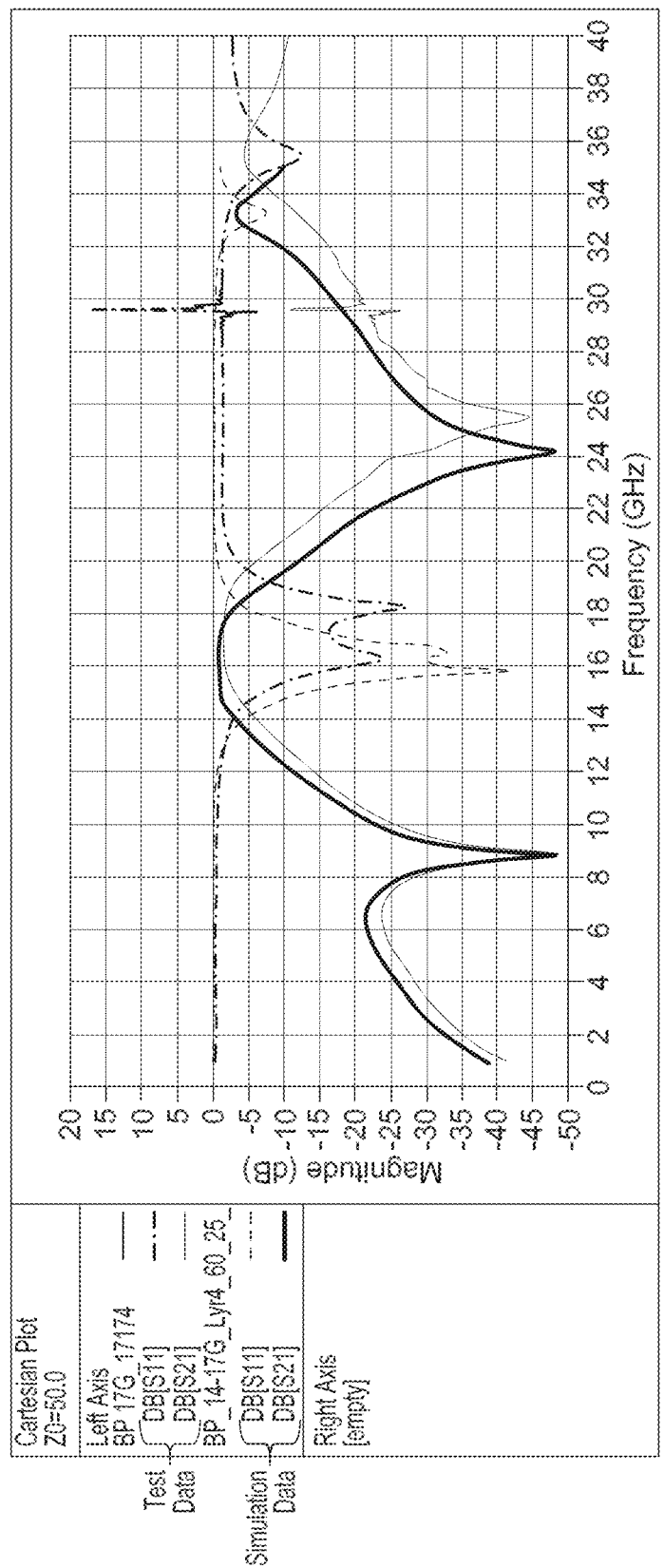
FIG. 13 is a plot of test data including measured insertion loss and return loss values for a filter constructed according to aspects of the present disclosure.

Referring to FIG. 13, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 16.1 GHz to about 18.2 GHz.

Figure 14:
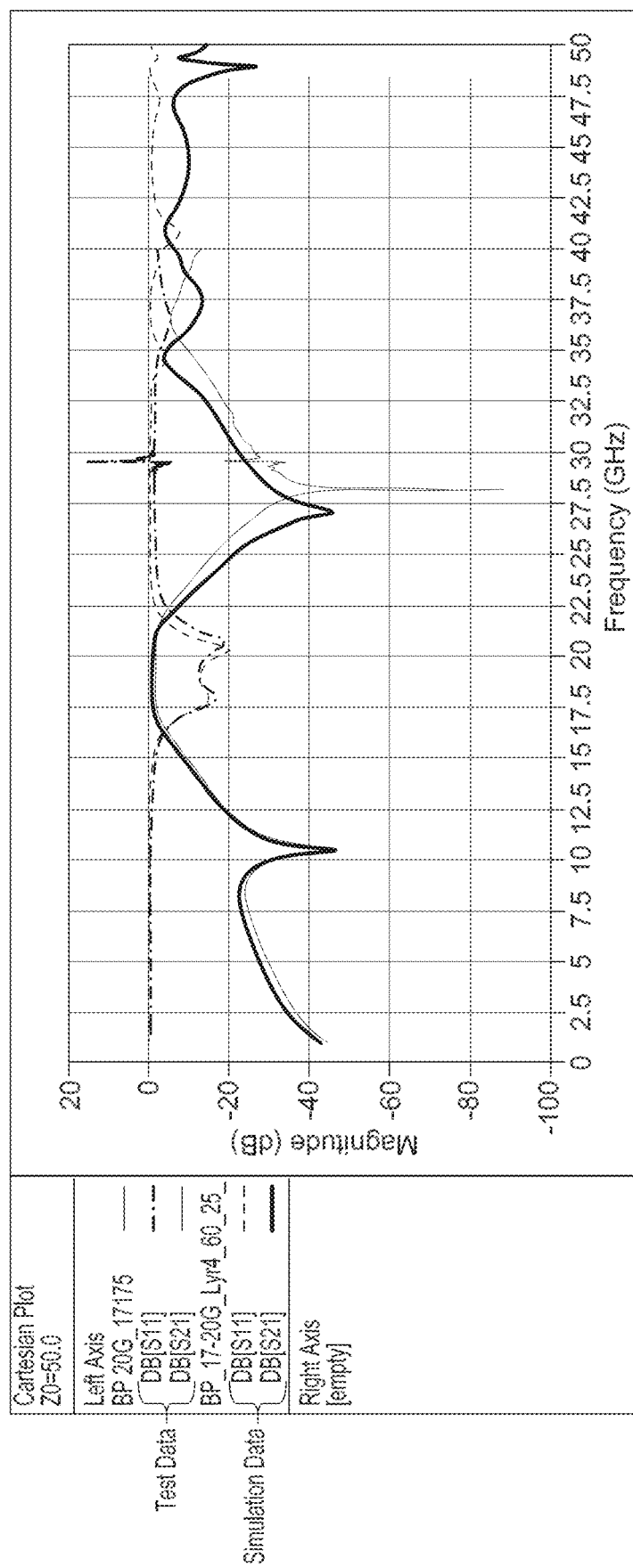
FIG. 14 is a plot of test data including measured insertion loss and return loss values for a filter constructed according to aspects of the present disclosure.

Referring to FIG. 14, the multilayer filter 300 described above with reference to FIGS. 3A through 4E was both simulated and built and physically tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 17.0 GHz to about 21.2 GHz.

Figure 15:
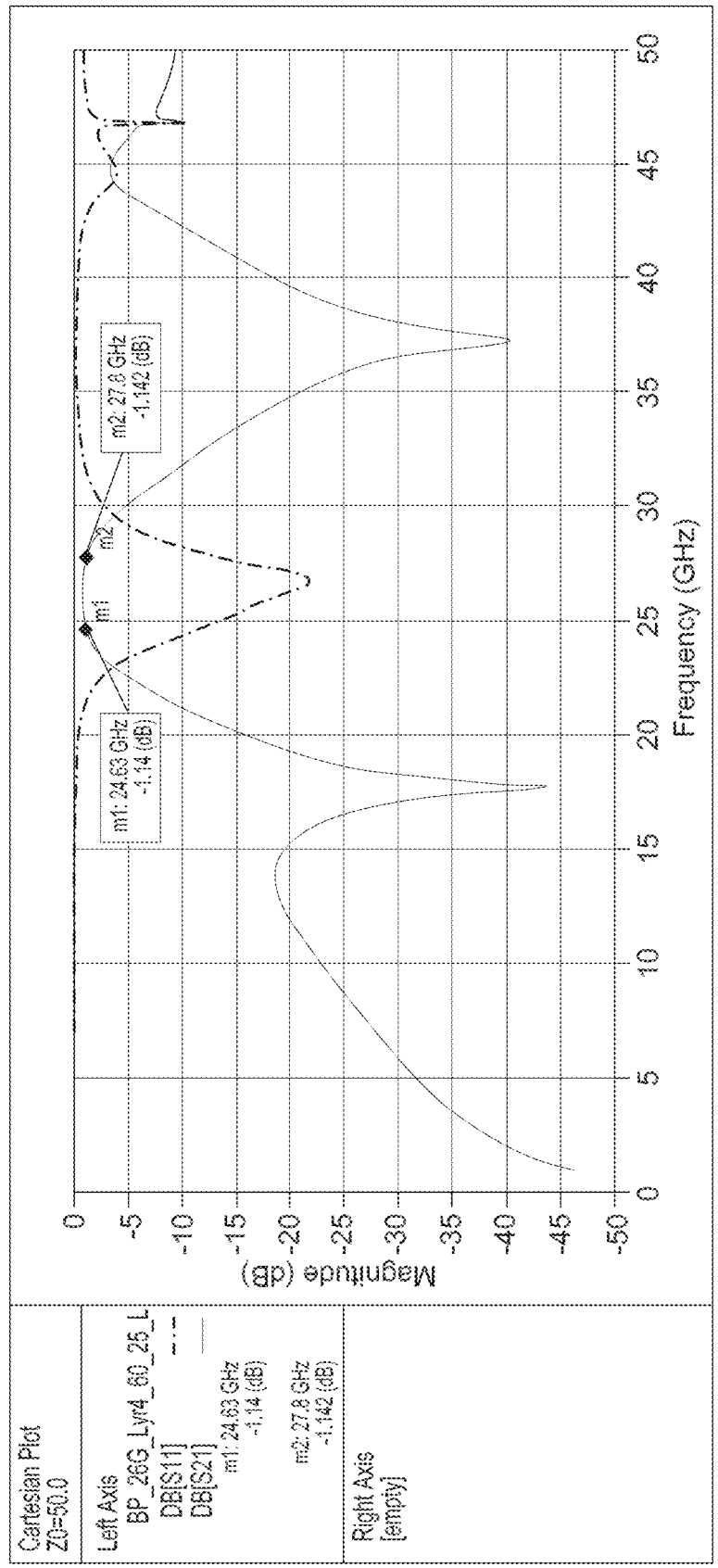
FIG. 15 is a plot of simulation data including insertion loss and return loss values from a computer analysis of a filter according to aspects of the present disclosure.

Referring to FIG. 15, the multilayer filter 600 described above with reference to FIGS. 6A through 7D was simulated. Simulated insertion loss ($S_{21}$) values and simulated return loss ($S_{11}$) values are plotted from 0 GHz to 50 GHz. The pass band is from about 24.6 GHz to about 27.8 GHz.

Figure 16:
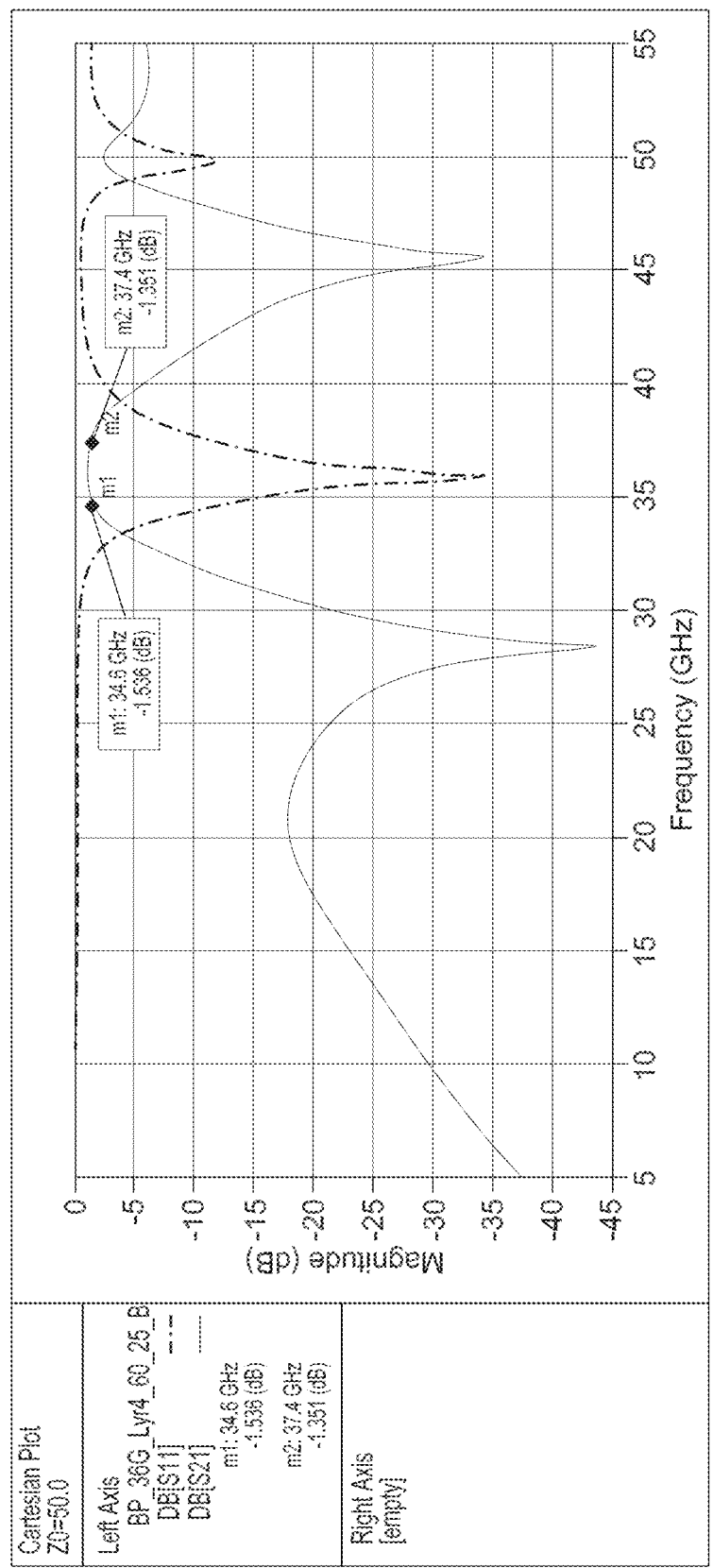
FIG. 16 is a plot of simulation data including insertion loss and return loss values from a computer analysis of a filter according to aspects of the present disclosure.

Referring to FIG. 16, the multilayer filter 800 described above with reference to FIGS. 8A through 9D was simulated. Simulated insertion loss ($S_{21}$) values and simulated return loss ($S_{11}$) values are plotted from 0 GHz to 55 GHz. The pass band is from about 34.6 GHz to about 37.4 GHz.

Figure 17:
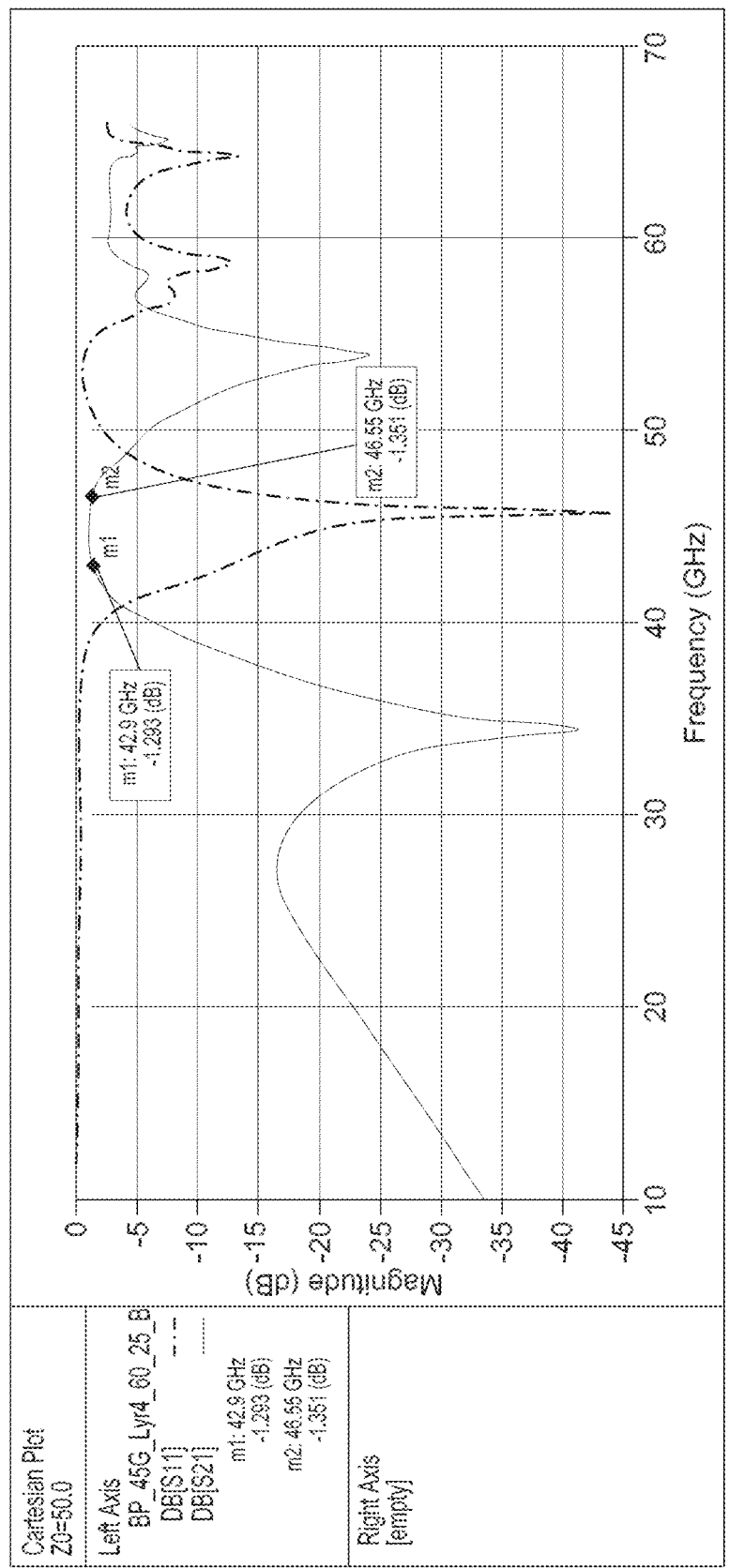
FIG. 17 is a plot of simulation data including insertion loss and return loss values from a computer analysis of a filter according to aspects of the present disclosure.

Referring to FIG. 17, the multilayer filter 1000 described above with reference to FIGS. 10A through 11D was simulated. Simulated insertion loss ($S_{21}$) values and simulated return loss ($S_{11}$) values are plotted from 0 GHz to 70 GHz. The pass band is from about 42.9 GHz to about 46.6 GHz.

EXAMPLES

It should be understood that the following dimensions and ratios are merely given as examples and do not limit the scope of the present disclosure. For example, in some embodiments, processes may be employed that can achieve greater precision in shaping the conductive layers, resulting in a smaller minimum line width.

Referring again to FIG. 5A, the inductor 356 may have dimensions as shown where each minimum line width 510 (in the X-direction and Y-direction) is about 51 microns. In other words, for the purposes of this Examples section, FIG. 5A may be considered drawn to scale. The inductor 356 has an average width of approximately 5.36 minimum line widths 501 (e.g., about 272 microns). The total effective length is 14 minimum line widths 501 (e.g., about 711 microns). Thus the length-to-average-width ratio of the inductor 356 is approximately 2.61.

In comparison, a similar inductor lacking the protrusion 364 would have an average width of about 5.14 minimum line widths 501 (e.g., about 261 microns) and a length-to-average-width ratio of about 2.72. Thus, the protrusion 364 increased the average width by about 4 percent and decreased the length-to-average-width ratio by about 4 percent. Furthermore, increasing the distance 518 (e.g., length) associated with the protrusion 364 by a single minimum line width 501 (e.g., about 51 microns) would increase the average width of the inductor 534 by only about 1.3 percent and decrease the length-to-average-width ratio by only about 1.3 percent. Thus, adjusting the dimensions of the protrusion 364 can be used to finely tune the length-to-average-width ratio, and thereby finely tune the inductance of the inductor 356.

Referring again to FIG. 5B, the inductor 530 may have dimensions as shown where each minimum line width 510 (in the X-direction and Y-direction) is about 51 microns. In other words, for the purposes of this Examples section, FIG. 5B may be considered drawn to scale. The inductor 530 may have an average width of about 5.29 minimum line widths 501 (e.g., about 269 microns) and a length-to-average-width ratio of about 1.32. In comparison, a similar inductor lacking the protrusions 588 would have an average width of 4 minimum line widths 501 (e.g., about 203 microns) and a length-to-average-width ratio of about 1.75. Thus, the protrusions 544, 558 increased the average width by about 32 percent and decreased the length-to-average-width ratio by about 24 percent. Furthermore, increasing the length 546 of either protrusion 558 by a single minimum line width 510 would increase the average width of the inductor 530 by only about 8.1 percent and decrease the length-to-average-width ratio by only about 8.8 percent. Thus, adjusting the dimensions of one or more of the protrusions 544, 558 can be used to finely tune the length-to-average-width ratio, and thereby finely tune the inductance of the inductor 530.

Referring again to FIG. 5C, the inductor 572 may have dimensions as shown where each minimum line width 510 (in the X-direction and Y-direction) is about 51 microns. In other words, for the purposes of this Examples section, FIG. 5C may be considered drawn to scale. The inductor 572 may have an average width of about 6.8 minimum line widths 501 (e.g., about 345 microns) and a length-to-average-width ratio of about 0.88. In comparison, a similar inductor lacking the protrusion 574 would have an average width of 6 minimum line widths 501 (e.g., about 305 microns) and a length-to-average-width ratio of about 1. Thus, the protrusion 574 increased the average width by about 14 percent and decreased the length-to-average-width ratio by about 12 percent.

Furthermore, decreasing an effective length (the second length 585) of the protrusion 574 by a single minimum line width 510 (e.g., about 51 microns) would increase the average width of the inductor 572 by only about 2.5 percent and decrease the length-to-average-width ratio by only about 2.44 percent. Thus, adjusting the dimensions of the protrusion 574 can be used to finely tune the length-to-average-width ratio, and thereby finely tune the inductance of the inductor 572.

Referring again to FIG. 5D, the inductor 587 may have an average width of about 4.8 minimum line widths 501 (e.g., about 244 microns) and a length-to-average-width ratio of about 2.08. In comparison, a similar inductor lacking the protrusions 588 would have an average width of 4.4 minimum line widths 510 (e.g., about 224 microns) and a length-to-average-width ratio of about 2.27. Thus, the protrusions 588 increased the average width by about 9.1 percent and decreased the length-to-average-width ratio by about 8.3 percent.

Furthermore, increasing the effective length 596 of either protrusion 588 by a single minimum line width 510 (e.g., about 51 microns) would increase the average width of the inductor 587 by only about 2.08 percent and decrease the length-to-average-width ratio by only about 2.04 percent. Thus, adjusting the dimensions of one or more of the protrusions 588 can be used to finely tune the length-to-average-width ratio, and thereby finely tune the inductance of the inductor 587.

Test Methods

Figure 18:
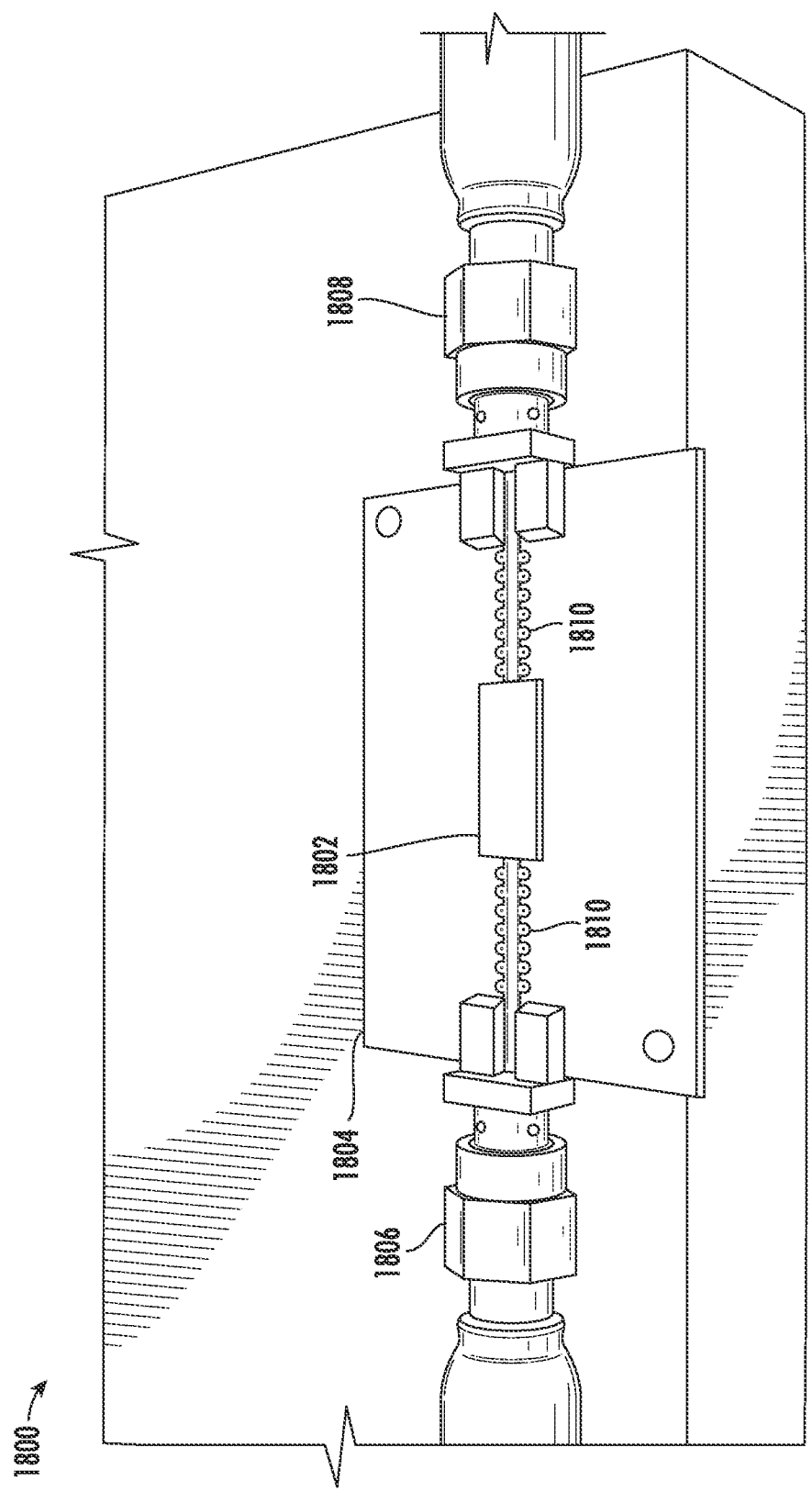
FIG. 18 is a perspective view of a testing assembly including a filter according to aspects of the present disclosure.

Referring to FIG. 18, a testing assembly 1800 can be used to test performance characteristics, such as insertion loss and return loss, of a multilayer filter 1802 according to aspects of the present disclosure. The filter 1802 can be mounted to a test board 1804. An input line 1806 and an output line 1808 were each connected with the test board 1804. The test board 1804 may include microstrip lines 1810 electrically connecting the input line 1806 with an input of the filter 1802 and electrically connecting the output line 1808 with an output of the filter 1802. An input signal was applied to the input line using a source signal generator (e.g., a 1806 Keithley 2400 series Source Measure Unit (SMU), for example, a Keithley 2410-C SMU) and the resulting output of the filter 1802 was measured at the output line 1808 (e.g., using the source signal generator). This was repeated for various configurations of the filter.

These and other modifications and variations of the present disclosure may be practiced by those of ordinary skill in the art, without departing from the spirit and scope of the present disclosure. In addition, it should be understood that aspects of the various embodiments may be interchanged both in whole and in part. Furthermore, those of ordinary skill in the art will appreciate that the foregoing description is by way of example only, and is not intended to limit the disclosure so further described in such appended claims.

What is claimed is:

1. A multilayer electronic device comprising:
   a plurality of dielectric layers;
   a signal path having an input and an output; and
   an inductor comprising a conductive layer overlying one of the plurality of dielectric layers, and wherein the inductor is electrically connected at a first location with the signal path and electrically connected at a second location with at least one of the signal path or a ground, and wherein:
   the inductor has an outer perimeter comprising a first straight edge that faces outward in a first direction and a second straight edge that is parallel to the first straight edge and faces outward in the first direction;
   the second straight edge is offset from the first straight edge in the first direction by an offset distance that is less than about 500 microns and less than about 90% of a first width of the inductor in the first direction at the first straight edge; and
   the inductor has a second width at the second straight edge in the first direction, and wherein a ratio of the second width to the first width ranges from about 1.02 to about 1.9.

2. The multilayer electronic device of claim 1, further comprising a dielectric material that comprises an epoxy.

3. The multilayer electronic device of claim 1, wherein the outer perimeter comprises a width discontinuity edge extending between the first straight edge and the second straight edge.

4. The multilayer electronic device of claim 3, wherein the width discontinuity edge is perpendicular to the first straight edge and second straight edge.

5. The multilayer electronic device of claim 3, wherein the width discontinuity edge is spaced apart from a corner of a longitudinal centerline of the inductor by at least about 30 microns.

6. The multilayer electronic device of claim 1, wherein the offset distance is approximately equal to a minimum line width.

7. The multilayer electronic device of claim 1, wherein the inductor has a length-to-average-width ratio that is less than about 10.

8. The multilayer electronic device of claim 1, wherein the inductor has an average width that is less than about 1 mm.

9. The multilayer electronic device of claim 1, wherein the inductor has an effective length that is less than about 2 mm.

10. The multilayer electronic device of claim 1, wherein the inductor comprises an additional width discontinuity edge, and wherein the additional width discontinuity edge and the width discontinuity edge are symmetric about at least one of a longitudinal centerline or a lateral centerline of the inductor.

11. The multilayer electronic device of claim 1, wherein the multilayer electronic device is configured as a filter.

12. The multilayer electronic device of claim 11, wherein the filter has a characteristic frequency that is greater than about 6 GHz.

13. The multilayer electronic device of claim 12, wherein the characteristic frequency comprises at least one of a low pass frequency, a high pass frequency, or an upper bound of a bandpass frequency.

14. The multilayer electronic device of claim 1, wherein the conductive layer is a first conductive layer and further comprising:
   a second conductive layer overlying a respective one dielectric layer of the plurality of dielectric layers, wherein the second conductive layer and the first conductive layer are spaced apart in the Z-direction by less than 100 microns.

15. The multilayer electronic device of claim 1. wherein the conductive layer is a first conductive layer and further comprising:
   a second conductive layer overlying a respective one dielectric layer of the plurality of dielectric layers:
   a ground plane; and
   a via electrically connecting at least one of the first conductive layer or the second conductive layer to the ground plane.

16. The multilayer electronic device of claim 1, further comprising a dielectric material having a dielectric constant that is less than about 100 as determined in accordance with IPC TM-650 2.5.5.3 at an operating temperature of 25° C. and frequency of 1 MHz.

17. The multilayer electronic device of claim 1, further comprising a dielectric material having a dielectric constant that is greater than about 100 as determined in accordance with IPC TM-650 2.5.5.3 at an operating temperature of 25° C. and frequency of 1 MHz.

18. The multilayer electronic device of claim 1, further comprising an organic dielectric material.

19. The multilayer electronic device of claim 18, wherein the organic dielectric material comprises at least one of liquid crystalline polymer or polyphenyl ether.

20. A multilayer electronic device comprising:
   a plurality of dielectric layers;
   a signal path having an input and an output; and
   an inductor comprising a conductive layer overlying one of the plurality of dielectric layers, and wherein the inductor is electrically connected at a first location with the signal path and electrically connected at a second location with at least one of the signal path or a ground, and wherein:
   the inductor has an outer perimeter comprising a first straight edge that faces outward in a first direction and a second straight edge that is parallel to the first straight edge and faces outward in the first direction;

the second straight edge is offset from the first straight edge in the first direction by an offset distance that is less than about 500 microns and less than about 90% of a first width of the inductor in the first direction at the first straight edge; and the outer perimeter comprises a width discontinuity edge extending between the first straight edge and the second straight edge, the width discontinuity edge being spaced apart from a corner of a longitudinal centerline of the inductor by at least about 30 microns.

21. A multilayer electronic device comprising:
a plurality of dielectric layers;
a signal path having an input and an output; and
an inductor comprising a conductive layer overlying one of the plurality of dielectric layers, and wherein the inductor is electrically connected at a first location with the signal path and electrically connected at a second location with at least one of the signal path or a ground, and wherein:

the inductor has an outer perimeter comprising a first straight edge that faces outward in a first direction and a second straight edge that is parallel to the first straight edge and faces outward in the first direction;

the second straight edge is offset from the first straight edge in the first direction by an offset distance that is less than about 500 microns and less than about 90% of a first width of the inductor in the first direction at the first straight edge; and the offset distance is approximately equal to a minimum line width.

22. A method of designing an inductor for a multilayer electronic device, the method comprising:
selecting an effective length and a width for the inductor based on a target inductance value for the inductor;
sizing an offset distance associated with a protrusion of the inductor, the offset distance being between a first straight edge of a perimeter of the inductor and a second straight edge of the perimeter of the inductor, the offset distance being less than 500 microns and less than about 90% of a first width of the inductor in a first direction at the first straight edge, wherein the first straight edge faces outward in the first direction, and the second straight edge is parallel with the first straight edge and faces outward in the first direction, and wherein the inductor has a second width at the second straight edge in the first direction, and wherein a ratio of the second width to the first width ranges from about 1.02 to about 1.9.

23. A multilayer electronic device comprising:
a plurality of dielectric layers;
a signal path having an input and an output; and
an inductor comprising a conductive layer overlying one of the plurality of dielectric layers, and wherein the inductor is electrically connected at a first location with the signal path and electrically connected at a second location with at least one of the signal path or a ground, and wherein:

the inductor has an outer perimeter comprising a first straight edge that faces outward in a first direction and a second straight edge that is parallel to the first straight edge and faces outward in the first direction;

the second straight edge is offset from the first straight edge in the first direction by an offset distance that is less than about 500 microns and less than about 90% of a first width of the inductor in the first direction at the first straight edge; and the outer perimeter comprises a width discontinuity edge extending between the first straight edge and the second straight edge, the width discontinuity edge being perpendicular to the first straight edge and second straight edge.

* * * * *